US010109529B2

(12) United States Patent
Koh et al.

(10) Patent No.: US 10,109,529 B2
(45) Date of Patent: Oct. 23, 2018

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Young-ho Koh, Seongnam-si (KR); Byoung-ho Kwon, Hwaseong-si (KR); Yang-hee Lee, Incheon (KR); Young-kuk Kim, Seoul (KR); In-seak Hwang, Suwon-si (KR); Bo-un Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 15/185,253

(22) Filed: Jun. 17, 2016

(65) Prior Publication Data

US 2017/0084710 A1 Mar. 23, 2017

(30) Foreign Application Priority Data

Sep. 23, 2015 (KR) .......................... 10-2015-0134814

(51) Int. Cl.
*H01L 29/423* (2006.01)
*H01L 21/8234* (2006.01)
*H01L 27/108* (2006.01)

(52) U.S. Cl.
CPC ............... *H01L 21/823475* (2013.01); *H01L 27/10814* (2013.01); *H01L 27/10823* (2013.01); *H01L 27/10852* (2013.01); *H01L 27/10876* (2013.01); *H01L 27/10897* (2013.01)

(58) Field of Classification Search
None
See application file for complete search history.

(56) References Cited

U.S. PATENT DOCUMENTS

| 7,034,367 | B2 | 4/2006 | Kobori |
| 7,071,529 | B2 | 7/2006 | Miyagawa et al. |
| 7,179,744 | B2 | 2/2007 | Lee et al. |

(Continued)

FOREIGN PATENT DOCUMENTS

| JP | 2011018835 A | 1/2011 |
| KR | 10-2002-0082667 | 10/2002 |

(Continued)

*Primary Examiner* — Jack Chen
(74) *Attorney, Agent, or Firm* — Harness, Dickey & Pierce, P.L.C.

(57) ABSTRACT

A semiconductor device including a direct contact and a bit line in a cell array region and a gate electrode structure in a peripheral circuit region, and a method of manufacturing the semiconductor device are provided. The semiconductor device includes a substrate including a cell array region including a first active region and a peripheral circuit region including a second active region, a first insulating layer on the substrate, the first insulating layer including contact holes exposing the first active region, a direct contact in the contact holes, wherein a direct contact is connected to the first active region, a bit line connected to the direct contact in the cell array region and extending in a first direction, and a gate insulating layer and a gate electrode structure, wherein a dummy conductive layer including substantially the same material as the direct contact is in the peripheral circuit region.

11 Claims, 29 Drawing Sheets

(56) References Cited

U.S. PATENT DOCUMENTS

| | | |
|---|---|---|
| 7,745,325 B2 | 6/2010 | Koh et al. |
| 8,772,051 B1 | 7/2014 | Zhong et al. |
| 2016/0118331 A1* | 4/2016 | Kim .................. H01L 27/10894 257/401 |

FOREIGN PATENT DOCUMENTS

| | | |
|---|---|---|
| KR | 10-2003-0058628 | 7/2003 |
| KR | 10-2006-0022573 | 3/2006 |
| KR | 10-2016-0049870 | 5/2016 |

* cited by examiner

SEMICONDUCTOR DEVICE AND METHOD OF MANUFACTURING THE SAME

CROSS-REFERENCE TO RELATED APPLICATION

This application claims the benefit of priority from Korean Patent Application No. 10-2015-0134814, filed on Sep. 23, 2015, in the Korean Intellectual Property Office, the disclosure of which is incorporated herein in its entirety by reference.

BACKGROUND

The inventive concepts relate to a semiconductor device, and more particularly, to a semiconductor device, in which a direct contact and a bit line are formed in a cell array region and a gate electrode structure is formed in a peripheral circuit region, and/or a method of manufacturing the semiconductor device.

As the integration density of a semiconductor device increases, a design rule for elements of the semiconductor device decreases. In addition, in a method of manufacturing a highly integrated semiconductor device, a process of forming a direct contact and a bit line in a cell array region and a process of forming a gate electrode structure in a peripheral circuit region may be performed at the same time. As a process in the cell array region and a process in the peripheral circuit region are performed at the same time, a planarization process such as chemical mechanical polishing (CMP) may be performed in order for the height of the cell array region and the height of the peripheral circuit region to be maintained to be equal to each other.

SUMMARY

The inventive concepts provide a semiconductor device in which a direct contact and a bit line are formed in a cell array region and a reliable gate electrode structure is formed in a peripheral circuit region.

The inventive concepts provide a method of manufacturing the semiconductor device.

According to an example embodiment, a semiconductor device includes a substrate including a cell array region and a peripheral circuit region, the cell array region including a first active region defined by a first isolation layer, and the peripheral circuit region including a second active region defined by a second isolation layer, a first insulating layer formed on the substrate, in the cell array region, the first insulating layer including contact holes exposing the first active region, a direct contact formed in each of the contact holes, in the cell array region, wherein the direct contact is connected to the first active region and is buried in the substrate, a bit line connected to the direct contact in the cell array region and extending in a first direction, and a gate insulating layer and a gate electrode structure, formed on the second active region of the peripheral circuit region, wherein a dummy conductive layer including substantially the same material as the direct contact is in the peripheral circuit region.

According to another example embodiment, a semiconductor device includes a substrate including a cell array region and a peripheral circuit region, the cell array region including a first active region defined by a first isolation layer and the peripheral circuit region including a second active region defined by a second isolation layer, a word line formed on the substrate and in the cell array region, the word line having a buried structure and extending in a first direction, a buried insulating layer on the word line, a first insulating layer formed on the substrate and the buried insulating layer in the cell array region, the first insulating layer including contact holes exposing the first active region, a direct contact formed in each of the contact holes, in the cell array region, wherein the direct contact is connected to the first active region and is buried in the substrate, a bit line connected to the direct contact in the cell array region and extending in a second direction, a buried contact disposed between bit lines and connected to the first active region, and a gate insulating layer and a gate electrode structure, formed on the second active region of the peripheral circuit region, wherein a dummy conductive layer including substantially the same material as the direct contact is in the peripheral circuit region.

BRIEF DESCRIPTION OF THE DRAWINGS

Example embodiments will be more clearly understood from the following detailed description taken in conjunction with the accompanying drawings in which.

DETAILED DESCRIPTION

Figure 1:
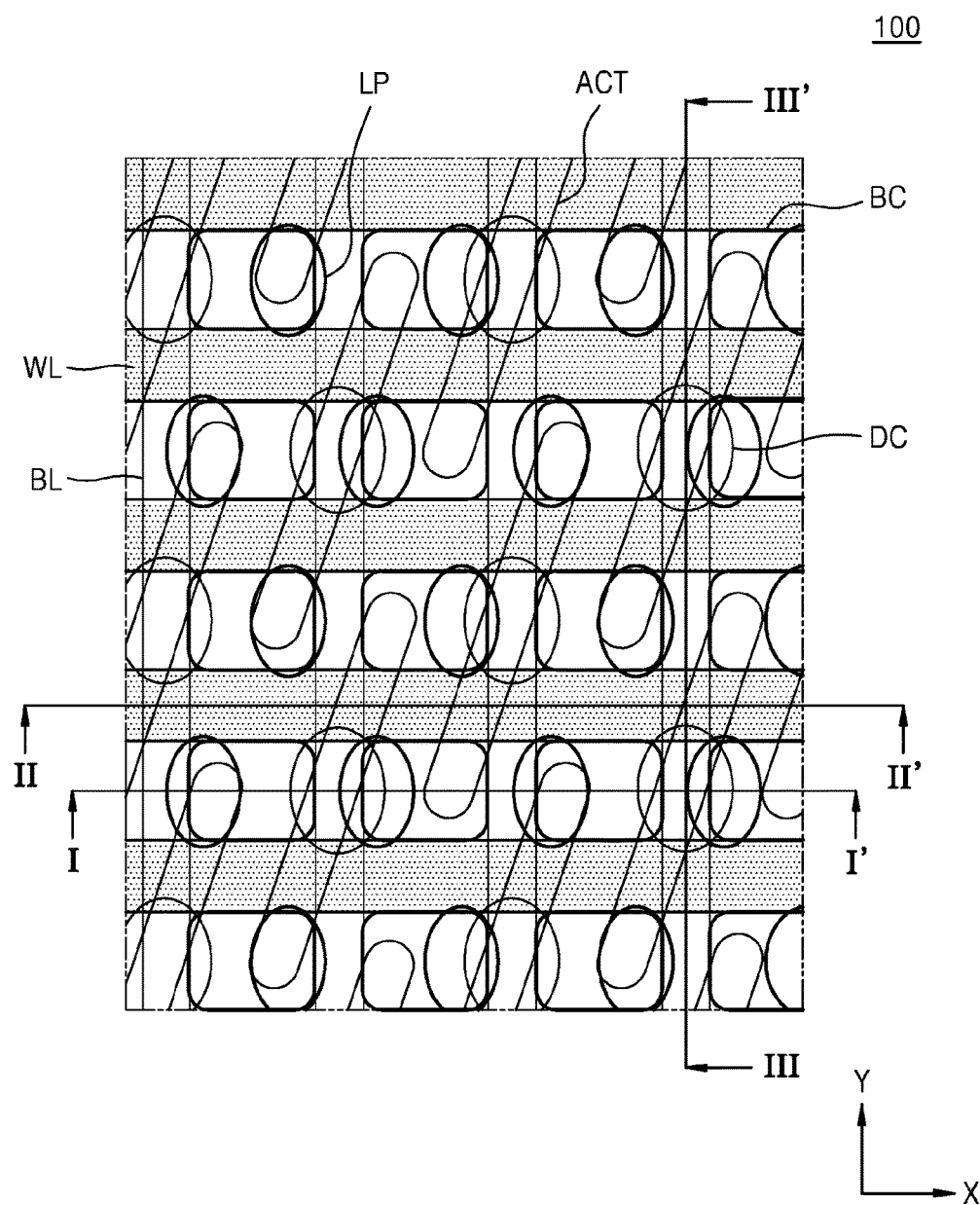
FIG. 1 is a schematic layout of a cell array region of a semiconductor device, according to an example embodiment.

Hereinafter, the inventive concepts will be described more fully with reference to the accompanying drawings, in which example embodiments of the inventive concepts are shown.

This inventive concepts may, however, be embodied in many different forms and should not be construed as limited to the example embodiments set forth herein. Rather, these example embodiments are provided so that this disclosure will be thorough and complete, and will fully convey the scope of the inventive concepts to those of ordinary skill in the art.

Throughout the specification, it will also be understood that when an element is referred to as being "on," "connected to" or "coupled to" another element, it can be directly on, connected or coupled to the other element, or intervening elements may also be present. Similarly, it will also be understood that when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of" when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Also, in the drawings, the structures or sizes of the elements are exaggerated for clarity, and redundant descriptions thereof are omitted. Like reference numerals denote like elements in the drawings. The terms used herein are for illustrative purpose of the present inventive concepts only and should not be construed to limit the meaning or the scope of the present inventive concepts as described in the claims.

FIG. 1 is a schematic layout of a cell array region of a semiconductor device 100 according to an example embodiment.

Referring to FIG. 1, the semiconductor device 100 may include active regions ACT. The active regions ACT may be disposed in a direction that is oblique to each of a first direction (X direction) and a second direction (Y direction). Word lines WL may run across the active regions ACT, extend in the first direction (X direction), and be disposed substantially parallel to one another in the second direction (Y direction). Bit lines BL may extend on the word lines WL in the second direction (Y direction) and be disposed substantially parallel to one another in the first direction (X direction). The bit lines BL may be connected to the active regions ACT through direct contacts DC.

In example embodiments, buried contacts BC may be formed between two adjacent bit lines BL. Each, or one or more, of the buried contacts BC may extend up to an upper portion of any one of the two adjacent bit lines BL. In example embodiments, the buried contacts BC may be arranged in a matrix shape in the first direction (X direction) and the second direction (Y direction).

Landing pads LP may be formed on the buried contacts BC. The buried contacts BC and the landing pads LP may be configured to connect lower electrodes (not shown) of capacitors formed on the bit lines BL to the active regions ACT. The landing pads LP may be disposed to at least partially overlap the buried contacts BC, respectively.

Figure 2:
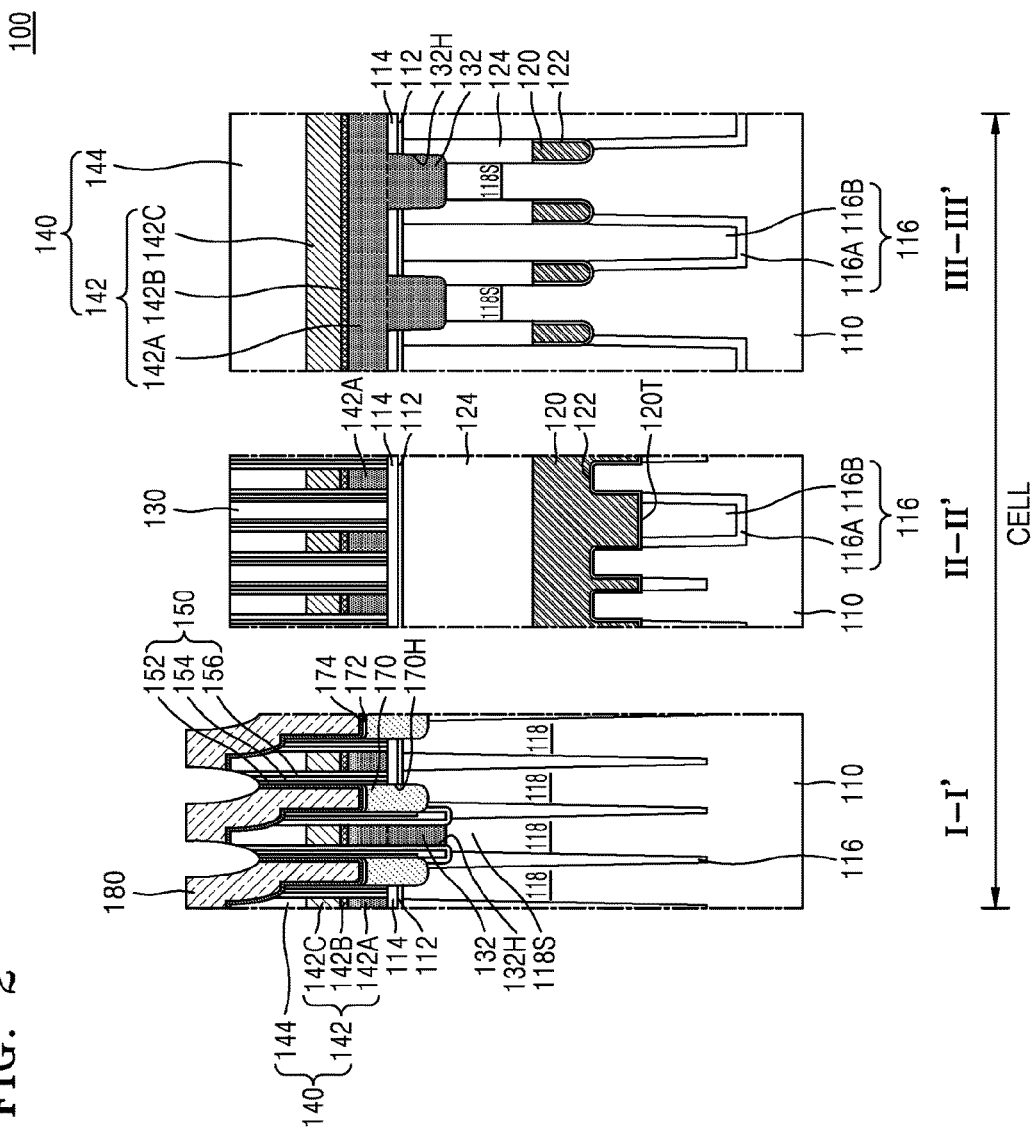
FIG. 2 is a cross-sectional view of the cell array region of the semiconductor device illustrated in FIG. 1.

FIG. 2 is a cross-sectional view of the cell array region CELL of the semiconductor device 100 illustrated in FIG. 1, and illustrates cross-sectional views taken along lines I-I', II-II', and III-III' of the cell array region CELL.

Referring to FIG. 2, the semiconductor device 100 may include a substrate 110 in which active regions 118 are defined by isolation layers 116. The active regions 118 may correspond to the active regions ACT shown in FIG. 1. Each, or one or more, of the isolation layers 116 may include a first isolation layer 116A and a second isolation layer 116B, as shown in FIG. 2. The first isolation layer 116A and the second isolation layer 116B may include different materials. Parts of the active regions 118 which contact a direct contact 132 may correspond to source regions 118S.

In example embodiments, the substrate 110 may include silicon, for example, single crystalline silicon, polycrystalline silicon, or amorphous silicon. In other example embodiments, the substrate 110 may include at least one of germanium (Ge), silicon germanium (SiGe), silicon carbide (SiC), gallium arsenide (GaAs), indium arsenide (InAs), and indium phosphide (InP). In example embodiments, the substrate 110 may include a conductive region, for example, a well doped with impurities or a structure doped with impurities.

Trenches 120T may be formed in the substrate 110 and extend in a first direction (X direction of FIG. 1), and gate insulating layers 122 and word lines 120 may be formed in the trenches 120T. The word lines 120 may correspond to the word lines WL shown in FIG. 1. A buried insulating layer 124 may be formed on the word lines 120.

Direct contact holes 132H may be formed in the substrate 110 and expose portions of the active regions 118. The direct contact holes 132H may be filled with a conductive material, and thus direct contacts 132 may be formed. The direct contacts 132 may correspond to the direct contacts DC shown in FIG. 1.

A first buffer insulating layer pattern 112 and a second buffer insulating layer pattern 114 may be formed, for example sequentially formed, on the substrate 110. Each, or at least one, of the first buffer insulating layer pattern 112 and the second buffer insulating layer pattern 114 may include silicon oxide, silicon nitride, or a combination thereof. Any one of the first and second buffer insulating layer patterns 112 and 114 may not be formed, Bit lines 142 may be formed on the second buffer insulating layer pattern 114 and extend substantially parallel to one another in a second direction (Y direction of FIG. 1). The bit lines 142 may correspond to the bit lines BL shown in FIG. 1. The bit lines 142 may be connected to the active regions 118 through the direct contacts 132, respectively.

Figure 9:
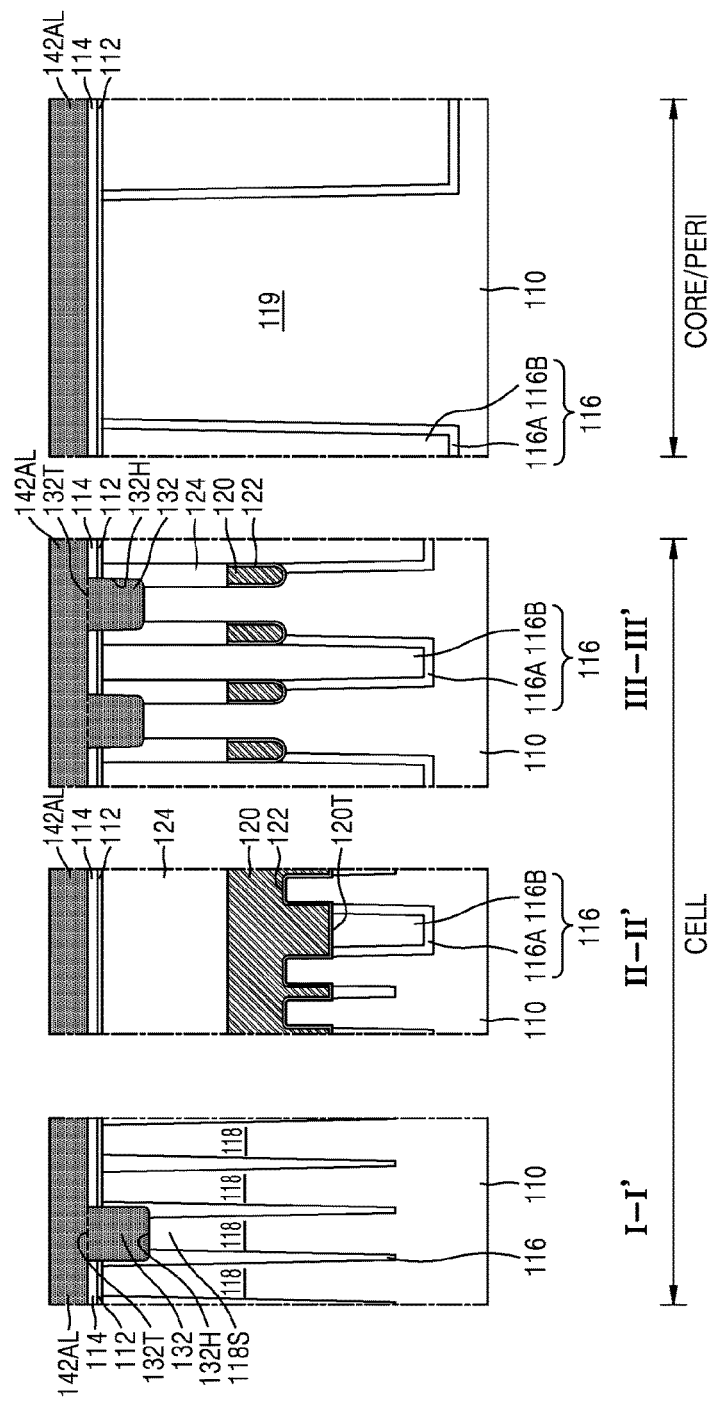

In the semiconductor device 100, the direct contacts 132 may be formed, for example integrally formed, with first conductive patterns 142A forming the bit lines 142. For example, as shown in FIG. 9, the direct contact holes 132H may be filled with a conductive material and thus the direct contacts 132 may be formed, and upper parts (i.e., the first conductive patterns 142A) of the direct contacts 132 may form lower portions of the bit lines 142. In a left side cross-sectional view (i.e., the cross-sectional view taken along the line I-I') and a right side cross-sectional view (i.e., the cross-sectional view taken along the line III-III'), a dotted line is illustrated to differentiate the direct contacts 132 from the first conductive patterns 142A. However, since the direct contacts 132 and the first conductive patterns 142A include the same conductive material, the direct contacts 132 may not be physically differentiated from the first conductive patterns 142A. For clarity, if parts under the dotted line are defined as the direct contacts 132, and parts above the dotted line are defined as the first conductive patterns 142, the upper surfaces of the direct contacts 132 may have the same plane as the upper surface of the second buffer insulating layer pattern 114.

In example embodiments, the direct contacts 132 may include silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TN), tantalum (Ta), tantalum nitride (TaN), copper (Cu), or a combination thereof. In example embodiments, the direct contacts 132 may include an epitaxial silicon layer. In the semiconductor device 100 according to the example embodiment, the direct contacts 132 may include polysilicon.

The direct contacts 132 may be formed in a bottom-up manner or a top-down manner. Examples of the bottom-up manner may include selective epitaxial growth (SEG), electroplating, electro-less plating (ELP), etc. Examples of the top-down manner may include chemical vapor deposition (CVD), atomic layer deposition (ALB), etc. However, the bottom-up manner and the top-down manner are not limited thereto. Resistance characteristics of the direct contacts 132 may be adjusted by adjusting a grain size or crystal structure of a seed layer. For example, the direct contacts 132 may have a resistance that is lower than the resistance of polysilicon (i.e. gate poly) that is used in a gate electrode structure.

Furthermore, in the semiconductor device 100 according to the example embodiment, the direct contacts 132 may be first formed, and the gate poly may subsequently be formed. Accordingly, a void or seam may be substantially prevented from being formed in the direct contacts 132. In addition, various problems, which may occur when the gate poly is first formed and the direct contacts 132 are formed.

Each, or at least one, of the bit lines 142 may include a first conductive pattern 142A that contacts the direct contacts 132. Also, each, or at least one, of the bit lines 142 may further include a second conductive pattern 142B and a third conductive pattern 142C, stacked, for example sequentially stacked on the first conductive pattern 142A. In FIG. 2, each, or at least one, of the bit lines 142 has a triple layer stack structure including the first conductive pattern 142A, the second conductive pattern 142B, and the third conductive pattern 142C. However, the inventive concepts are not limited thereto. For example, each, or at least one, of the bit lines 142 may include a single layer, a double layer, or a multilayered stack structure including four or more layers.

As shown in the right side cross-sectional view (i.e., the cross-sectional view taken along the line III-III') of FIG. 2, the first conductive pattern 142A of each, or at least one, of the bit lines 142 may include a first part connected to the direct contacts 132 and a second part disposed between first parts and spaced apart from the substrate 110, with the first buffer insulating layer pattern 112 and the second buffer insulating layer pattern 114 therebetween. The first part and the second part may be formed, for example integrally formed and extend in the second direction (Y direction of FIG. 1) in which the bit lines 142 extend.

The first conductive pattern 142A may include substantially the same material as the direct contacts 132. Accordingly, the first conductive pattern 142A may include any one of the conductive materials described above with respect to the direct contacts 132. For example, in the semiconductor device 100 according to the example embodiment, the first conductive pattern 142A may include polysilicon. The second conductive pattern 142B may include titanium nitride (TiN), and the third conductive pattern 142C may include tungsten (W). However, the materials of the second and third conductive patterns 142B and 142C are not limited thereto.

Insulating capping lines 144 may be respectively formed on the bit lines 142. One bit line 142 and one insulating capping line 144 corresponding thereto may constitute one bit line structure 140.

Both sidewalls of each, or at least one, of the bit line structures 140 may be covered with an insulating spacer structure 150. Each, or at least one, of the insulating spacer structures 150 may include a first insulating spacer 152, a second insulating spacer 154, and a third insulating spacer 156. In example embodiments, each, or at least one, of the first insulating spacer 152, the second insulating spacer 154, and the third insulating spacer 156 may include an oxide layer, a nitride layer, or a combination thereof. In other example embodiments, each, or at least one, of the first insulating spacer 152 and the third insulating spacer 156 may include an oxide layer, a nitride layer, or a combination thereof, and the second insulating spacer 154 interposed between the first insulating spacer 152 and the third insulating spacer 156 may include an air spacer.

Insulating patterns 130 and buried contact holes 170H that are defined by the insulating patterns 130 may be formed in spaces between the bit lines 142. An inner space of each, or at least one, of the buried contact holes 170H may be defined by the insulating spacer structure 150 and the active region 118 between two adjacent bit lines 142. The buried contact holes 170H may be filled with a conductive material, and thus, buried contacts 170 that are connected to the active regions 118 may be formed. Landing pads 180 may be respectively formed on the buried contacts 170. The buried contacts 170 may correspond to the buried contacts BC shown in FIG. 1, and the landing pads 180 may correspond to the landing pads LP shown in FIG. 1.

The buried contacts 170 may extend from the active regions 118 in a third direction substantially perpendicular to the substrate 110. The landing pads 180 may be disposed on the buried contacts 170 and extend above the bit lines 142, respectively. The landing pads 180 may be connected to the active regions 118 through the buried contacts 170. The landing pads 180 may extend in the third direction in regions between the bit lines 142 and cover at least portions of top surfaces of the bit lines 142 to vertically overlap portions of the bit lines 142.

Metal silicide layers 172 may be formed between the buried contacts 170 and the landing pads 180. The metal silicide layers 172 may include cobalt silicide (CoSix), nickel silicide (NiSix), or manganese silicide (MnSix), but are not limited thereto.

Conductive barrier layers 174 may be interposed between the landing pads 180 and the insulating spacer structures 150 and between the landing pads 180 and the bit line structures 140. The conductive barrier layers 174 may include a metal, a conductive metal nitride, or a combination thereof. For example, the conductive barrier layers 174 may have a Ti/TiN stack structure. The conductive barrier layers 174 may contact the insulating capping lines 144 of the bit line structures 140. Also, the conductive barrier layers 174 may be interposed between the metal silicide layers 172 and the landing pads 180.

Figure 3A:
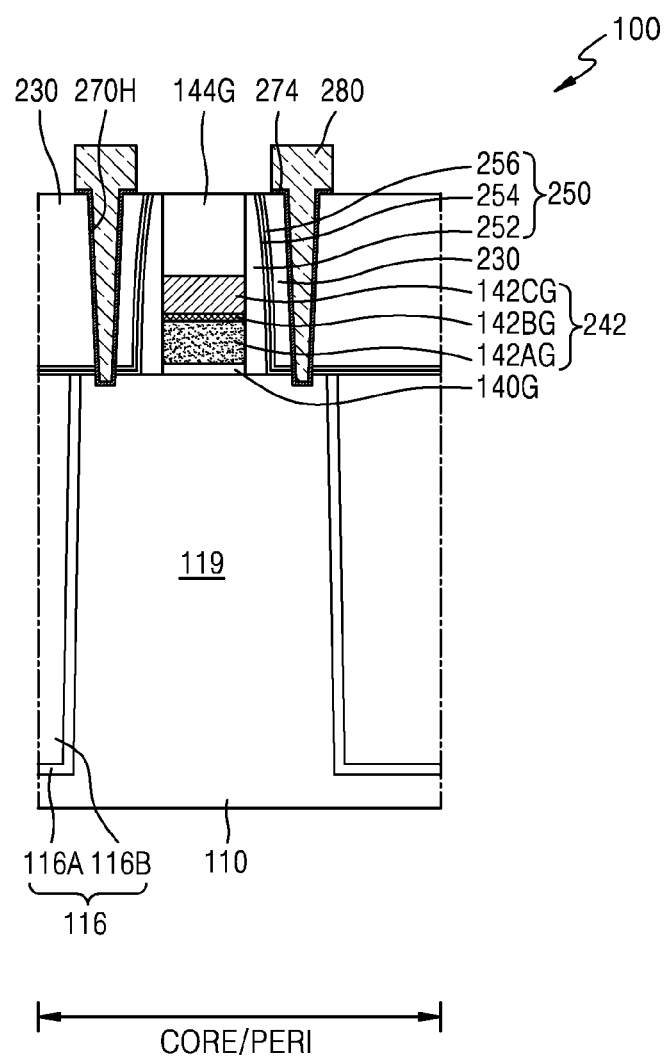
FIGS. 3A through 3C are cross-sectional views of a peripheral circuit region in the semiconductor device of FIG. 1.
Figure 3B:
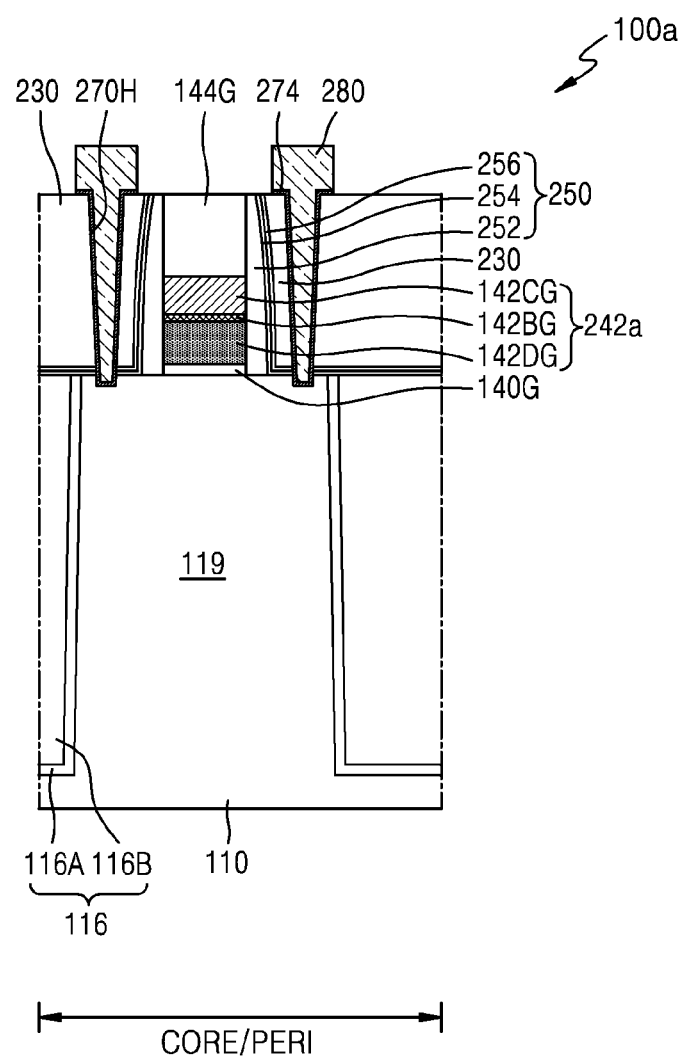
Figure 3C:
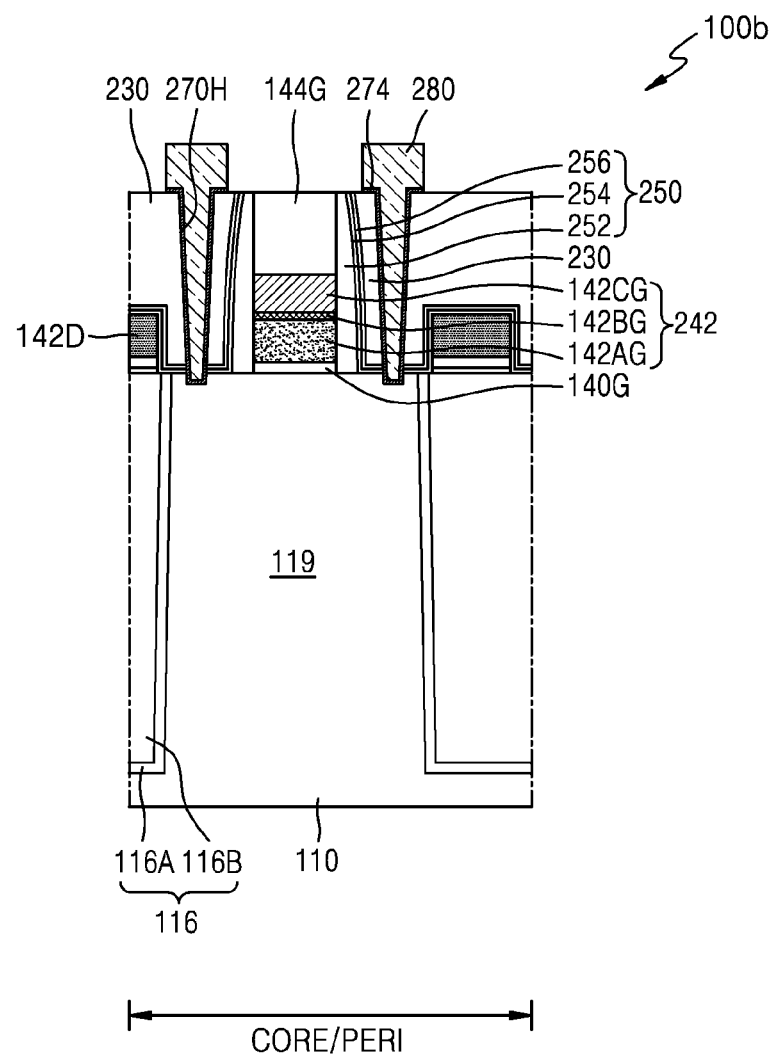

FIGS. 3A through 3C are cross-sectional views of a peripheral circuit region CORE/PERI in the semiconductor device 100 of FIG. 1. The structure of a cell array region (not shown) may be the same as the structure illustrated in FIG. 2.

Referring to FIG. 3A, in the peripheral circuit region CORE/PERI of the semiconductor device 100, active regions 119 may be defined in the substrate 110 by isolation layers 116, and a gate electrode structure 242 may be disposed on the active regions 119 with a gate insulating layer 140G interposed therebetween.

The gate electrode structure 242 may include a first gate conductive pattern 142AG, a second gate conductive pattern 142BG, and a third gate conductive pattern 142CG stacked, for example sequentially stacked, on the gate insulating layer 140G. The first gate conductive pattern 142AG may include a conductive material that is the same as or different from the conductive material of the first conductive pattern 142A of the bit lines 142. When the first gate conductive pattern 142AG includes a conductive material that is the same as the conductive material of the first conductive pattern 142A, both the first gate conductive pattern 142AG and the first conductive pattern 142A may include polysilicon. Even if both the first gate conductive pattern 142AG and the first conductive pattern 142A include polysilicon, the resistance of the first conductive pattern 142A may be lower than the resistance of the first gate conductive pattern 142AG through the adjustment of process conditions.

As described below with reference to FIGS. 8 through 18, the second gate conductive pattern 142BG may be formed, for example simultaneously or contemporaneously formed, with the second conductive pattern 142B of each, or at least one, of the bit lines 142, and the third gate conductive pattern 142CG may be formed simultaneously or contemporaneously with the third conductive pattern 142C of each, or at least one, of the bit lines 142. Accordingly, the second gate conductive pattern 142BG may include the same conductive material as the second conductive pattern 142B, and the third gate conductive pattern 142CG may include the same conductive material as the third conductive pattern 142C. The first gate conductive pattern 142AG and the first conductive pattern 142A may be formed at different time points. For example, the first conductive pattern 142A may be first formed and the first gate conductive pattern 142 AG may be subsequently formed.

A gate insulating capping line 144G may be formed on the gate electrode structure 242. The gate insulating capping line 144G may be formed simultaneously or contemporaneously with the insulating capping line 144 on each, or at least one, of the bit lines 142, and thus may include the same insulating material as the insulating capping line 144. An insulating spacer structure 250 may be formed at both sides of the gate electrode structure 242 and the gate insulating capping line 144G. The insulating spacer structure 250 may include a first insulating spacer 252, a second insulating spacer 254, and a third insulating spacer 256. The insulating spacer structure 250 may be formed simultaneously or contemporaneously with or separately from the insulating spacer structure 150 of the cell array region CELL. When the insulating spacer structure 250 is formed simultaneously or contemporaneously with the insulating spacer structure 150 of the cell array region CELL, the first insulating spacer 252, the second insulating spacer 254, and the third insulating spacer 256 may include the same material as the first insulating spacer 152, the second insulating spacer 154, and the third insulating spacer 156 of the cell array region CELL.

An insulating layer 230 may be formed to surround the insulating spacer structure 250 at the side of the insulating spacer structure 250. The insulating layer 230 may be a silicon oxide layer, a silicon nitride layer, or a combination thereof. Contact holes 270H may be formed in the insulating layer 230, and a conductive barrier layer 274 may be formed inside walls of the contact holes 270H. The contact holes 270H and the buried contact holes 170 of the cell array region CELL may be simultaneously or contemporaneously formed, and the conductive barrier layer 274 and the conductive barrier layer 174 of the cell array region CELL may be simultaneously or contemporaneously formed by using the same material.

A conductive line 280 may be formed on the conductive barrier layer 274. The conductive line 280 and the landing pad 180 of the cell array region CELL may be simultaneously or contemporaneously formed by using the same material. The conductive line 280 may include a metal, a metal nitride, conductive polysilicon, or a combination thereof. For example, the conductive line 280 may include Tungsten (W).

Figure 10:
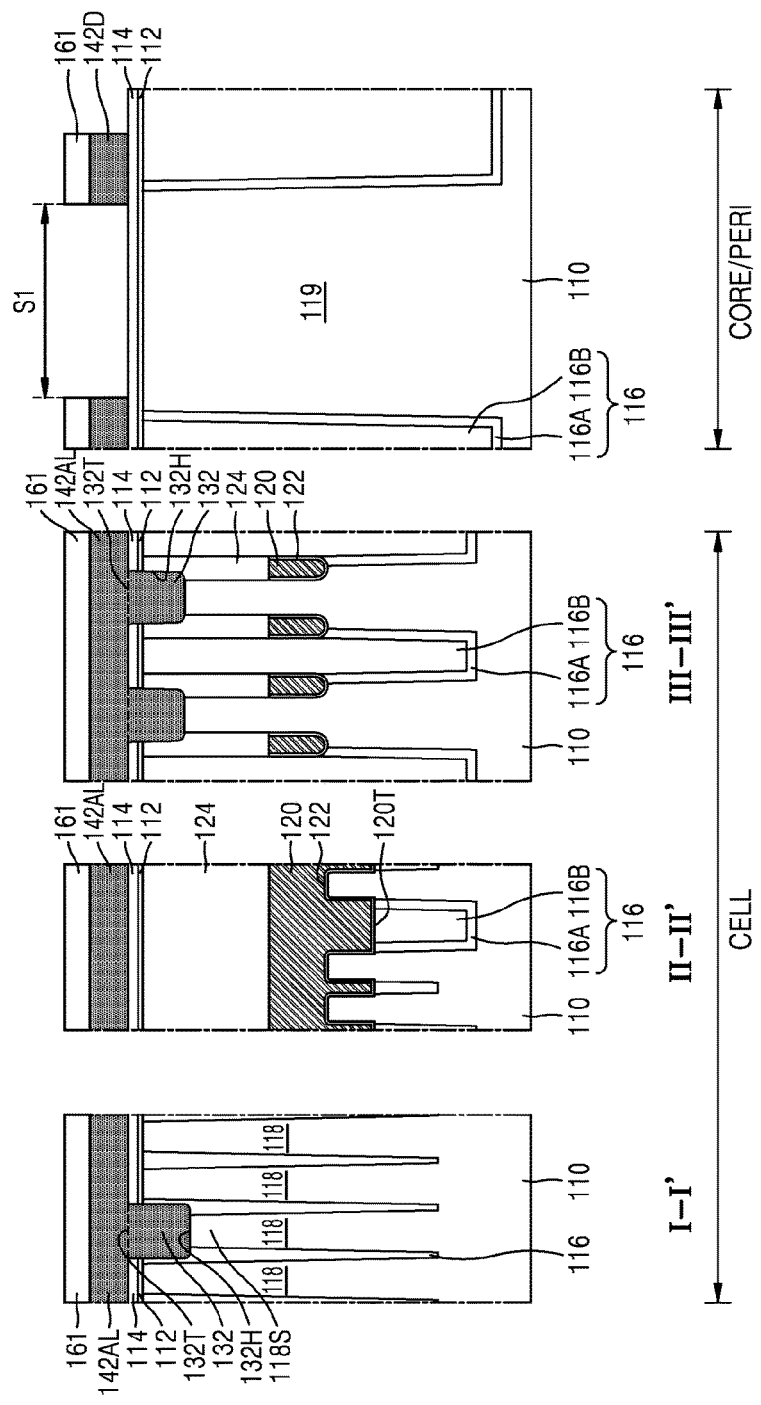

Furthermore, although not illustrated in FIGS. 3A through 3C, a dummy conductive layer, which corresponds to a dummy conductive layer 142D of FIG. 10, may exist in at least a portion of the peripheral circuit region CORE/PERI. For example, during a process of manufacturing the semiconductor device 100, some of dummy conductive layers may remain without being removed in a patterning process for forming the gate electrode structure 242 in the peripheral circuit region CORE/PERI. In the case of FIG. 3A, a dummy conductive layer adjacent to the gate electrode structure 242 is removed, and a dummy conductive layer is present in a position that is relatively far from the gate electrode structure, but is not illustrated for convenience.

Figure 12:
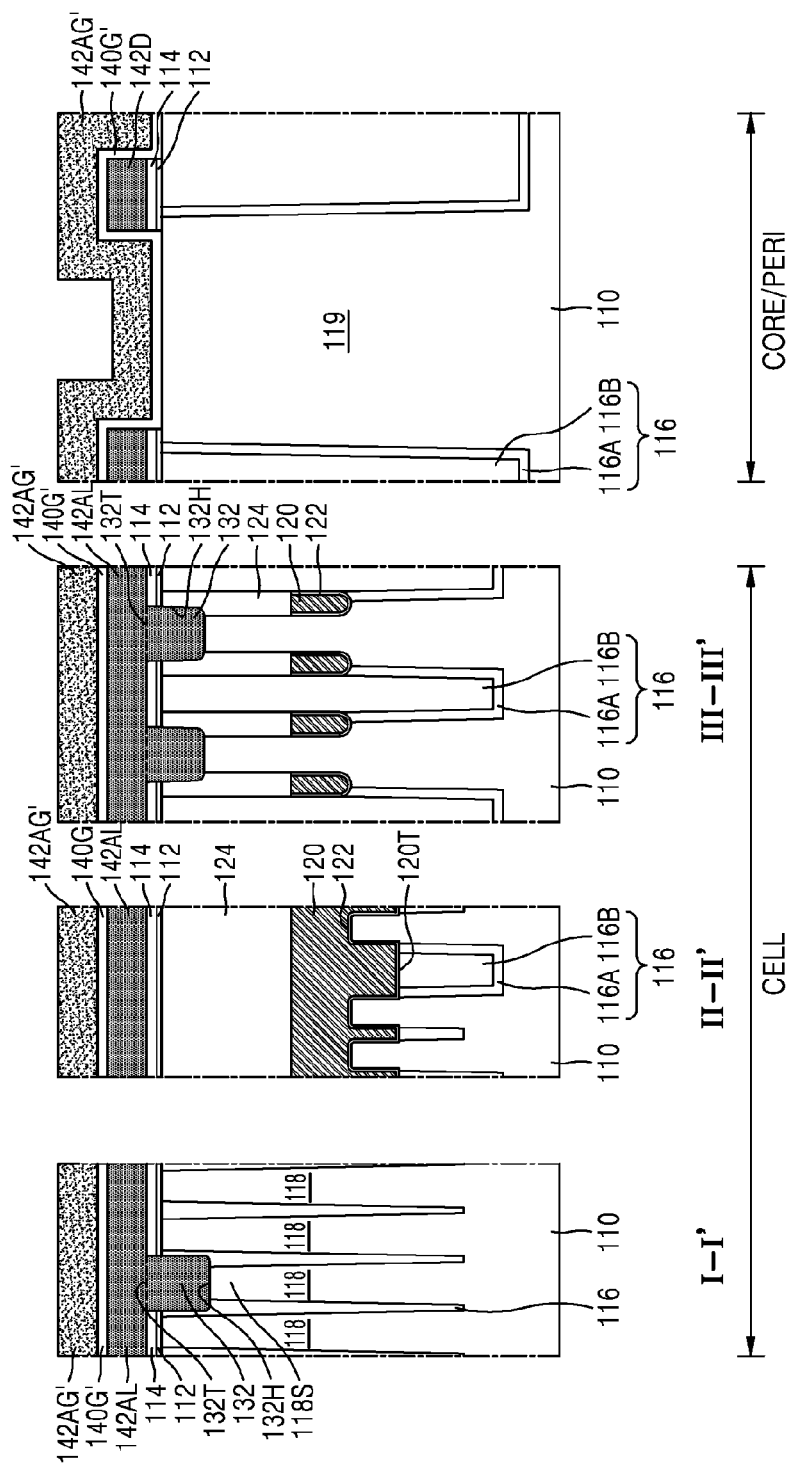
Figure 13:
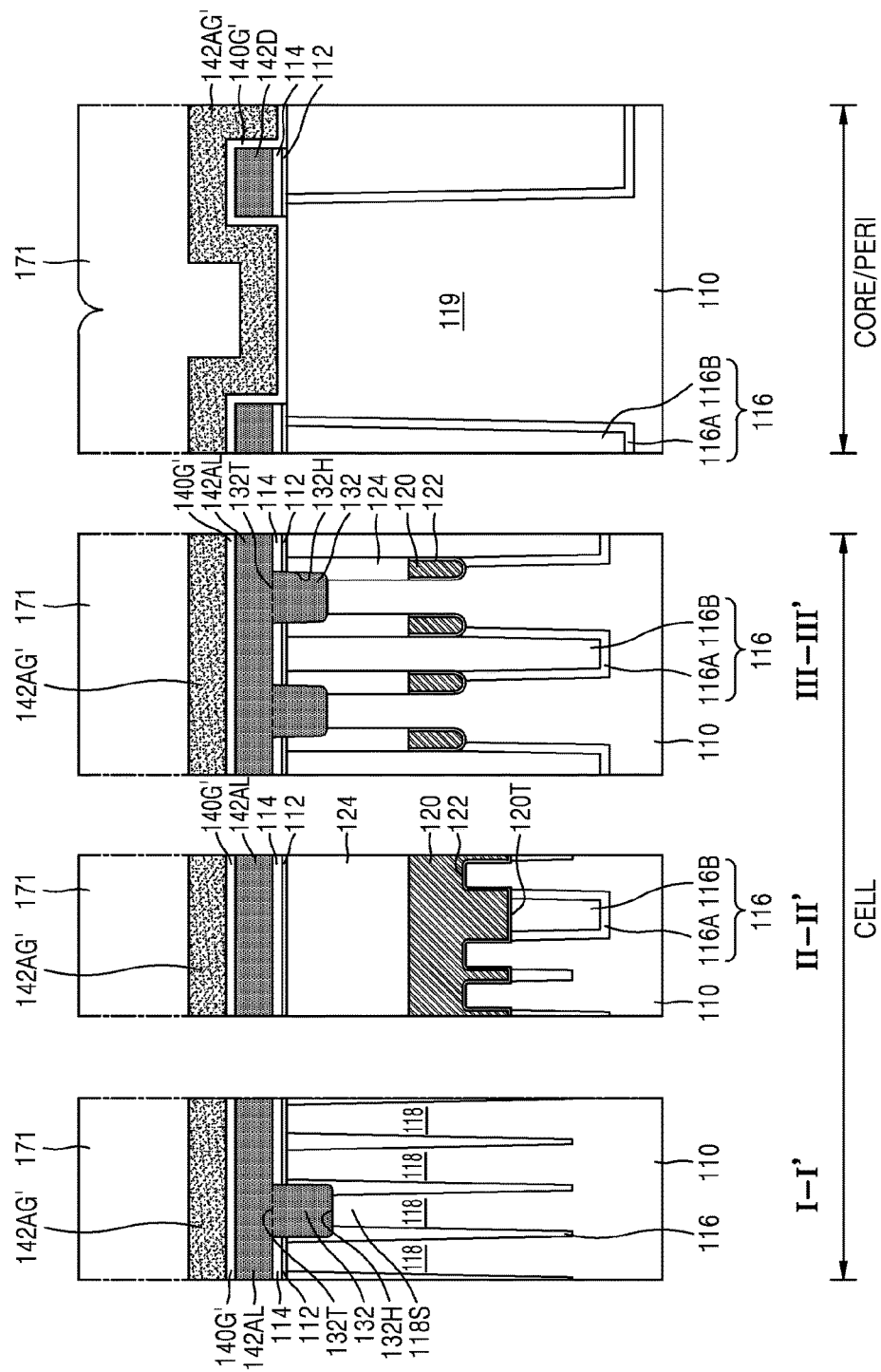
Figure 14:
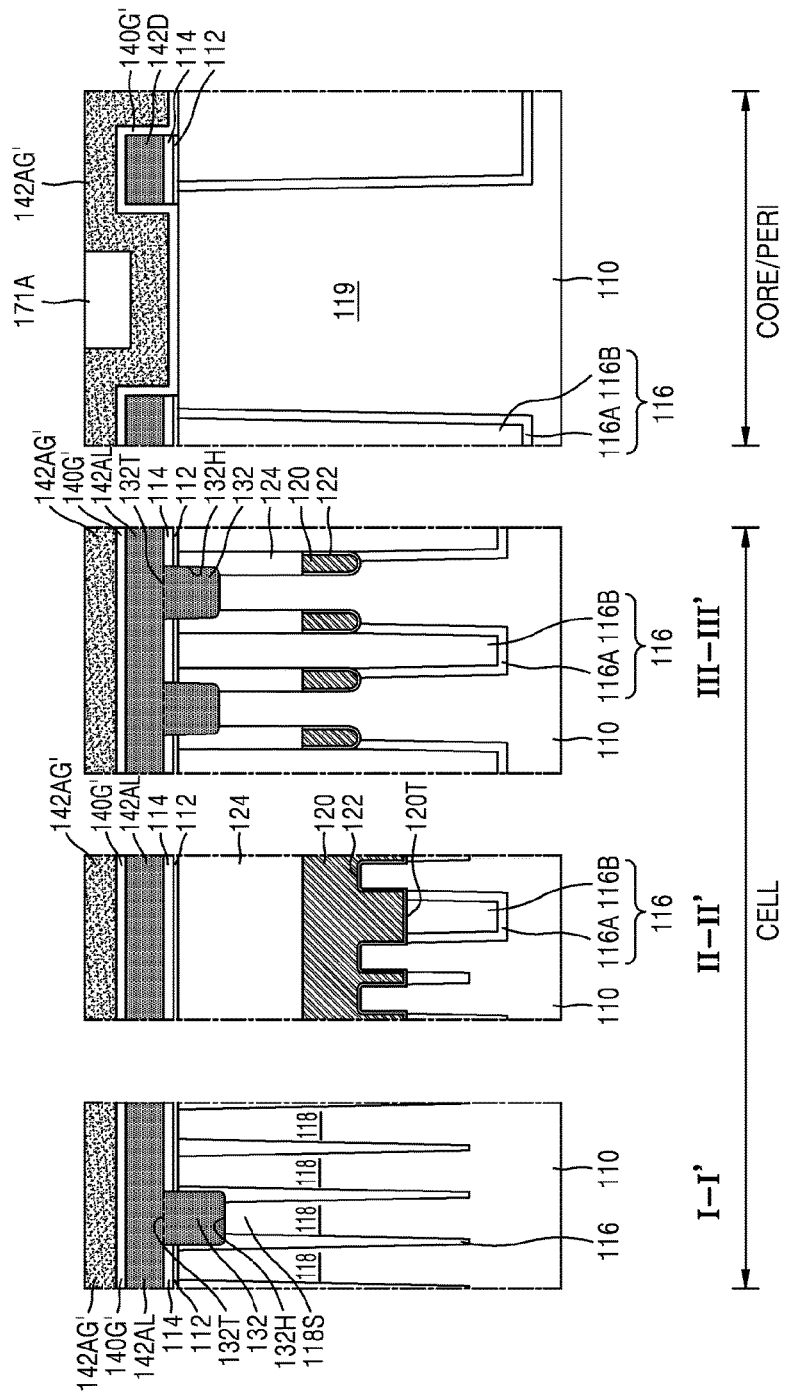

In the semiconductor device 100 according to an example embodiment, the gate electrode structure 242 of the peripheral circuit region CORE/PERI, particularly the first gate conductive pattern 142AG, may not be damaged in a planarization process due to the presence of the dummy conductive layer. In detail, as shown in FIGS. 12 through 14, in a process of planarizing a sacrificial layer 171 covering a first gate conductive layer 142AG' including polysilicon, the dummy conductive layer 142D and the first gate conductive layer 142AG' thereon serve as a chemical mechanical polishing (CMP) stopping layer, and thus, dishing of the sacrificial layer 171 may be reduced or prevented. Thus, the first gate conductive layer 142AG' under the sacrificial layer 171 may be substantially protected, and as a result, a damage of the first gate conductive pattern 142AG may be reduced or prevented. Accordingly, in the semiconductor device 100 according to the example embodiment, the gate electrode structure 242 that has improved electrical characteristics and is reliable may be implemented in the peripheral circuit region CORE/PERI. Also, in the semiconductor device 100 according to the example embodiment, an additional process may not be necessary since a dummy conductive layer 142D is formed in a patterning process for a first conductive layer 142AL, as shown in FIGS. 9 and 10. The process during which a lower layer, for example, the first gate conductive pattern 142AG, is not damaged in a planarization process due to the presence of the dummy conductive layer, will be described below in more detail with reference to FIGS. 5 through 7. In addition, an application of the principle to the semiconductor device 100 according to the example embodiment will be described below with reference to FIGS. 8 through 18.

Referring to FIG. 3B, a semiconductor device 100a is similar to or the same as the semiconductor device 100 of FIG. 3A except for a gate electrode structure 242a of a peripheral circuit region CORE/PERI. Specifically, the gate electrode structure 242a of the semiconductor device 100a may include a first gate conductive pattern 142DG, a second gate conductive pattern 142BG, and a third gate conductive pattern 142CG, and only the first gate conductive pattern 142DG may be different from the first gate conductive pattern 142AG of the gate electrode structure 242 in the semiconductor device 100 of FIG. 3A.

For example, the first gate conductive pattern 142DG may be formed based on a dummy conductive layer that is formed to reduce or prevent damage of a lower layer during a planarization process. The dummy conductive layer may be formed simultaneously or contemporaneously with the first conductive pattern 142A of the cell array region CELL. Accordingly, the first gate conductive pattern 142DG may include the same material as the first conductive pattern 142A. For example, the first gate conductive pattern 142DG may include polysilicon. Also, the first gate conductive pattern 142DG may have substantially the same resistance as the first conductive pattern 142A.

In the semiconductor device 100a, the first gate conductive pattern 42DG of the gate electrode structure 242a of the peripheral circuit region CORE/PERI is not damaged during a planarization process due to the presence of the dummy conductive layer, and thus, the gate electrode structure 242a that has excellent electrical characteristics and is reliable may be implemented in the peripheral circuit region CORE/PERI. A structure in which the gate electrode structure 142a of the semiconductor device 100a includes the first gate conductive pattern 142DG that is based on a dummy conductive layer will be described below in detail with reference to FIG. 19.

Referring to FIG. 3C, a semiconductor device 100b is similar to or the same as the semiconductor device 100 of FIG. 3A, but may be different from the semiconductor device 100 of FIG. 3A in that a dummy conductive layer 142D is adjacent to a gate electrode structure 242 of a peripheral circuit region CORE/PERI. Specifically, in the semiconductor device 100b, the gate electrode structure 242 may be formed by performing a patterning process on the peripheral circuit region CORE/PERI, and the dummy conductive layer 142D may be adjacent to the gate electrode structure 242 by not removing the dummy conductive layer 142D at both sides of a first gate conductive layer that corresponds to a first gate conductive layer 142AG" of FIG. 16.

Also, the gate electrode structure 242 may be formed by using a process (see FIGS. 8 through 18) similar to or the same as a process of manufacturing the semiconductor device 100 of FIG. 3A, and the dummy conductive layer 142D may remain adjacent to the gate electrode structure 242 by forming and patterning a second conductive layer 142BL, a third conductive layer 142CL, and an insulating layer 144L which have etch selectivity with respect to the dummy conductive layer 142D.

When interlayer insulating layers are formed after the gate electrode structure 242 is formed, the dummy conductive layer 142D may be used as a CMP stopping layer directly or indirectly during a planarization process for the interlayer insulating layers. Here, "directly" may denote that the dummy conductive layer 142D itself serves as a CMP stopping layer, and "indirectly" may denote that at least one upper layer formed on the dummy conductive layer 142D serves as a CMP stopping layer during a planarization process similar to or the same as the process described with regard to FIG. 14.

When the dummy conductive layer 142D adjacent to the gate electrode structure 242 is present, a portion of the dummy conductive layer 142D may be etched in the process of patterning the gate electrode structure 242, and thus the size of the dummy conductive layer 142D may be decreased.

Figure 4:
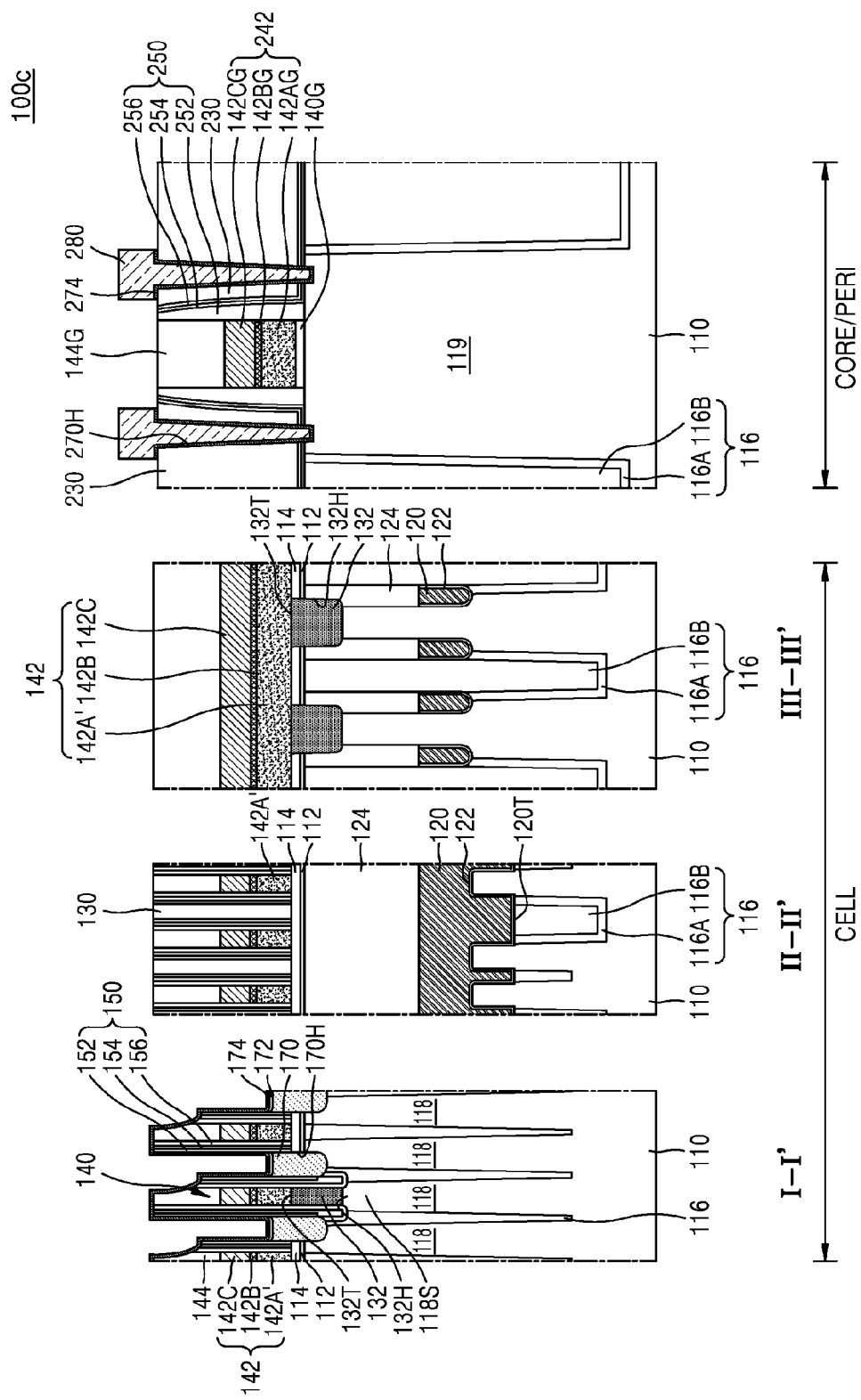
FIG. 4 is a cross-sectional view of a semiconductor device, according to an example embodiment.

FIG. 4 is a cross-sectional view of a semiconductor device 100c according to an example embodiment of the inventive concepts. Content described above with reference to FIGS. 1 through 3C will be briefly described or omitted.

Referring to FIG. 4, a structure of a direct contact 132 and a bit line 142 in a cell array region CELL of the semiconductor device 100c may be different from the structure of the semiconductor device 100 illustrated in FIGS. 2 and 3A. Specifically, in the semiconductor device 100c, the direct contact 132 and a first conductive contact 142A' of the bit line 142 may be formed by different processes. Accordingly, the material of the direct contact 132 may be different from the material of the first conductive contact 142A'.

For example, the direct contact 132 may include epitaxial silicon, metal, metal, or metal nitride, and the first conductive contact 142A may include polysilicon. Although the direct contact 132 and the first conductive contact 142A' are formed by different processes, the direct contact 132 and the first conductive contact 142A' may include the same material. For example, both the direct contact 132 and the first conductive contact 142A' may include polysilicon.

A gate electrode structure 242 of a peripheral circuit region CORE/PERI may have a structure that is the same as the structure of the gate electrode structure 242 of the semiconductor device 100 illustrated in FIGS. 2 and 3A. However, the inventive concepts are not limited thereto. For example, the semiconductor device 100c may include the gate electrode structure 242a of the semiconductor device 100a illustrated in FIG. 3B instead of the gate electrode structure 242 of the semiconductor device 100 illustrated in FIGS. 2 and 3A. In other words, the semiconductor device 100c may include the gate electrode structure 242a including the first gate conductive pattern 142DG that is based on a dummy conductive layer.

Figure 5A:
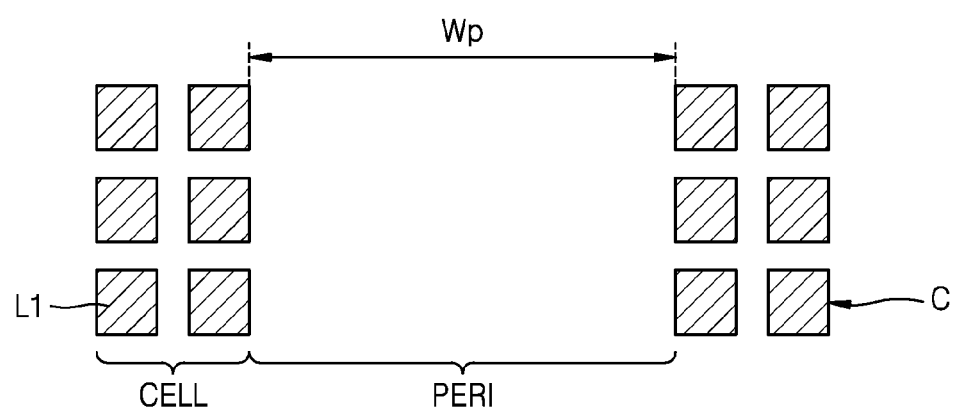
FIGS. 5A through 7B are plan views and cross-sectional views which show a principle of a semiconductor process applied to semiconductor devices, according to example embodiments.
Figure 5B:
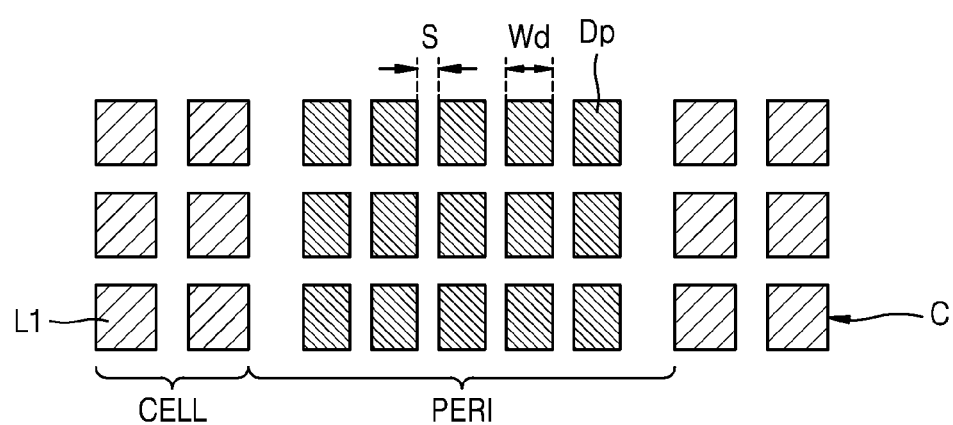
Figure 6A:
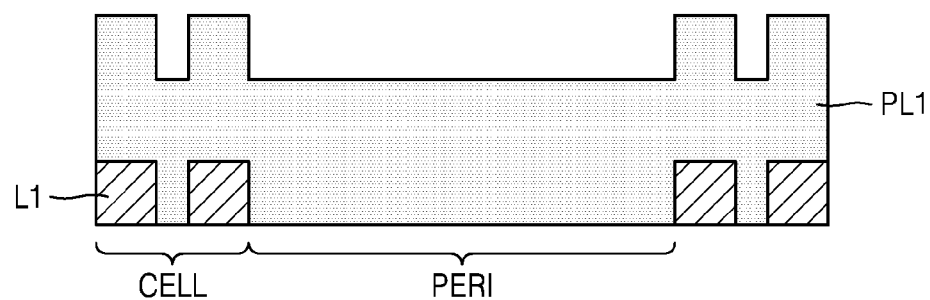
Figure 6B:
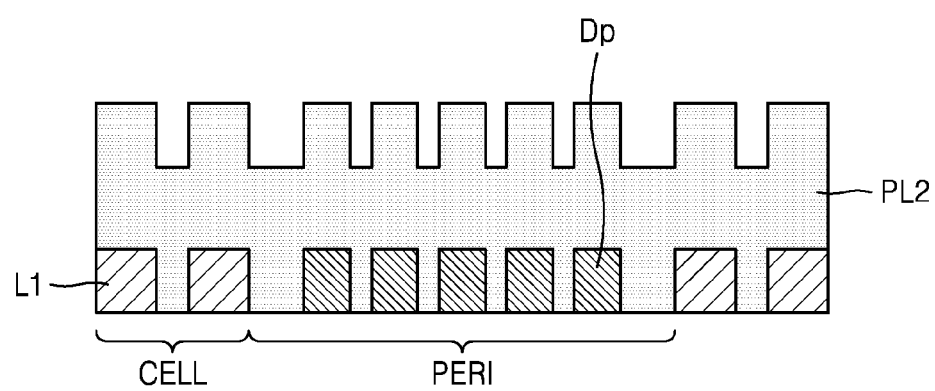
Figure 7A:
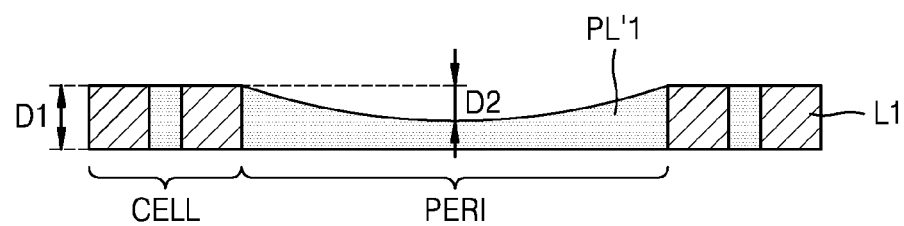
Figure 7B:
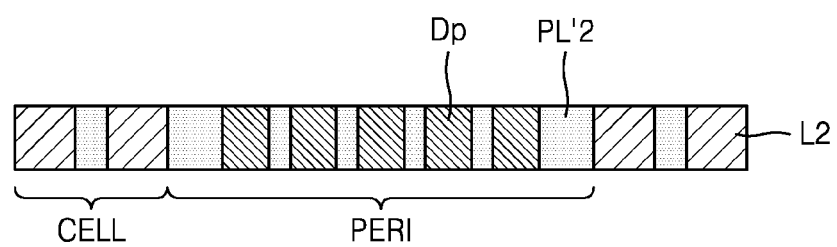

FIGS. 5A through 7B are plan views and cross-sectional views which show a principle of a semiconductor process applied to the semiconductor devices according to the example embodiments described above. FIGS. 5A, 6A, and 7A illustrate structures in which a peripheral circuit region does not include dummy patterns, and FIGS. 5B, 6B, and 7B illustrate structures in which a peripheral circuit region includes dummy patterns. FIGS. 5A and 5B are the plan views, and FIGS. 6A and 6B and FIGS. 7A and 7B are cross-sectional views corresponding to the plan views of FIGS. 5A and 5B.

Referring to FIG. 5A, in a semiconductor device including a dynamic random access memory (DRAM) or a flash memory, cells C may be disposed at relatively narrow intervals in cell array regions CELL. A peripheral circuit region PERI may be disposed between the cell array regions CELL and have a relatively large area, as shown in FIG. 5A. For example, the width Wp of the peripheral circuit region PERI may have a maximum of about 800 μm.

As shown in FIG. 6A, a first material layer L1 having a desired, or alternatively predetermined height is formed in the cells C of the cell array regions CELL, whereas the first material layer L1 may not be formed in the peripheral circuit region PERI. In an example embodiment, the first material layer LA may be formed in the cells C and the peripheral circuit region PERI, but the height of the first material layer L1 may be lower in the peripheral circuit region PERI than in the cells C.

When a planarization material layer PL1 is formed on the first material layer L1 formed as described above and planarization is subsequently performed by using, for example, a CMP process, a dishing phenomenon in which a central portion of the peripheral circuit region PERI caves may occur. A material layer under the planarization material layer PL1 or the first material layer L1 may be exposed due to the dishing phenomenon and thus be damaged during the CMP process or during a subsequent process.

Referring to FIGS. 5B and 6B, a plurality of dummy patterns Dp may be formed in the peripheral circuit region PERI. The first material layer L1 or a lower material layer that is different from the first material layer L1 may be formed in the peripheral circuit region PERI. Accordingly, the dummy patterns Dp may be formed on the first material layer L1 or the lower material layer.

The dummy patterns Dp may be formed to reduce or prevent a dishing phenomenon of the peripheral circuit region PERI from occurring during planarization by a subsequent CMP process. Accordingly, the material of the dummy patterns Dp may be a material having high etch selectivity with respect to an upper material layer (i.e., planarization material layer PL1 or PL2 of FIG. 6A or 6B) formed on the dummy patterns Dp. As a result, in a CMP process for the planarization material layer PL1 or PL2, the dummy patterns Dp may serve as an etch stopping layer or a CMP stopping layer, or may be configured to assist a function of the CMP stopping layer. For example, when the planarization material layer PL1 or PL2 includes oxide, the dummy patterns Dp may include polysilicon.

The width Wd of the dummy patterns Dp and a space S between the dummy patterns Dp may be determined to optimally reduce or prevent a dishing phenomenon without increasing process difficulty. For example, when the space S between the dummy patterns Dp is maintained to be about 4.8 μm, the depth of dishing may be maintained to be 150 Å or less. The width Wd of the dummy patterns Dp may be maintained to be about several tens of μm so that the width Wd of the dummy patterns Dp is substantially similar to or the same as the width of the cells C. However, the width Wd of the dummy patterns Dp and the space S between the dummy patterns Dp are not limited to the numerical values stated above.

Narrow regions between the cells C of the cell array regions CELLS may form a core region. For example, the core region may have a width of about 12 μm, and a dishing phenomenon may also occur in the core region. Accordingly, if necessary, a semiconductor process principle that is applied to the peripheral circuit region PERI may also be applied to the core region. In FIGS. 3A through 4 and FIGS. 8 through 22, the peripheral circuit region CORE/PERI may denote that a peripheral circuit region includes a core region.

Referring to FIGS. 6A and 6B, the planarization material layer PL1 or PL2 may be formed in the cell array regions CELL and the peripheral circuit region PERI. Specifically, in FIG. 6A, the planarization material layer PL1 may be formed to cover the first material layers L1 of the cell array regions CELL and an upper surface of the peripheral circuit region PERI. In FIG. 6B, the planarization material layer PL2 may be formed to cover the first material layers L1 of the cell array regions CELL and the dummy patterns Dp of the peripheral circuit region PERI.

Referring to FIGS. 7A and 7B, planarization may be performed on the planarization material layer PL1 or PL2 by using a CMP process. The CMP process may be performed until upper surfaces of the first material layers L1 are exposed. In FIG. 7A, a dishing phenomenon may likely occur in a central portion of the peripheral circuit region PERI after planarization by the CMP process. On the other hand, in FIG. 7B, a dishing phenomenon may hardly occur in a central portion of the peripheral circuit region PERI after planarization by the CMP process. This is because in the case of FIG. 7B the dummy patterns Dp serve as a stopping layer with respect to CMP, and thus downward etching may be reduced or suppressed.

In this manner, by forming the dummy patterns Dp in a relatively large area and using the dummy patterns Dp as a CMP stopping layer, a material layer under the dummy patterns Dp may be substantially prevented from being damaged during the CMP process or a subsequent process. This principle may also be similarly applied to a case of performing planarization through CMP after sequentially forming a second material layer and the planarization material layer PL2 in the cell array region CELL and the peripheral circuit region PERI. In this case, the dummy patterns Dp may serve as an assistant to a CMP stopping layer and the second material layer on the dummy patterns Dp may serve as the CMP stopping layer. For example, the dummy patterns Dp may be indirectly used as a CMP stopping layer.

When the first material layer L1 has a first thickness D1 with respect to the upper surface of the peripheral circuit region PERI, a second thickness D2 that is dished in the peripheral circuit region PERI after planarization by a CMP process may have to be less than the first thickness D1. If the second thickness D2 is equal to or greater than the first thickness D1, the upper surface of the peripheral circuit region PERI may be exposed and thus a material layer forming the upper surface of the peripheral circuit region PERI may be damaged during a CMP process or a subsequent process. In addition, in order to stably perform a process, a thickness of a portion of the first material layer L1 which remains after a CMP process has to be a minimum of about 200 Å.

Specifically, if the first thickness D1 is about 500 Å, the second thickness D2 that is dished in the peripheral circuit region PERI after planarization by a CMP process has to be limited to 300 Å or less. Accordingly, a slurry for low dishing of about 300 Å or less may be required. However, even if the slurry for low dishing is used, it may be difficult to limit dishing to 300 Å or less when the width of the planarization material layer PL1 or PL2 is in the range of several tens of μm to several hundreds of μm. As a result, in a CMP process, the upper surface of the material of the peripheral circuit region PERI may be exposed and thus may be damaged.

FIGS. 8 through 18 are cross-sectional views illustrating a method of manufacturing a semiconductor device, according to an example embodiment of the inventive concepts. In FIGS. 8 through 18, cross-sectional views shown in a cell array region CELL corresponds to cross-sectional views taken along the lines I-I', II-II', and III-III' of the cell array region CELL of the semiconductor device 100 illustrated in FIG. 1 and across-sectional view illustrated in a peripheral circuit region CORE/PERI corresponds to a cross-sectional view of the peripheral circuit region CORE/PERI of the semiconductor device 100 illustrated in FIG. 1.

Figure 8:
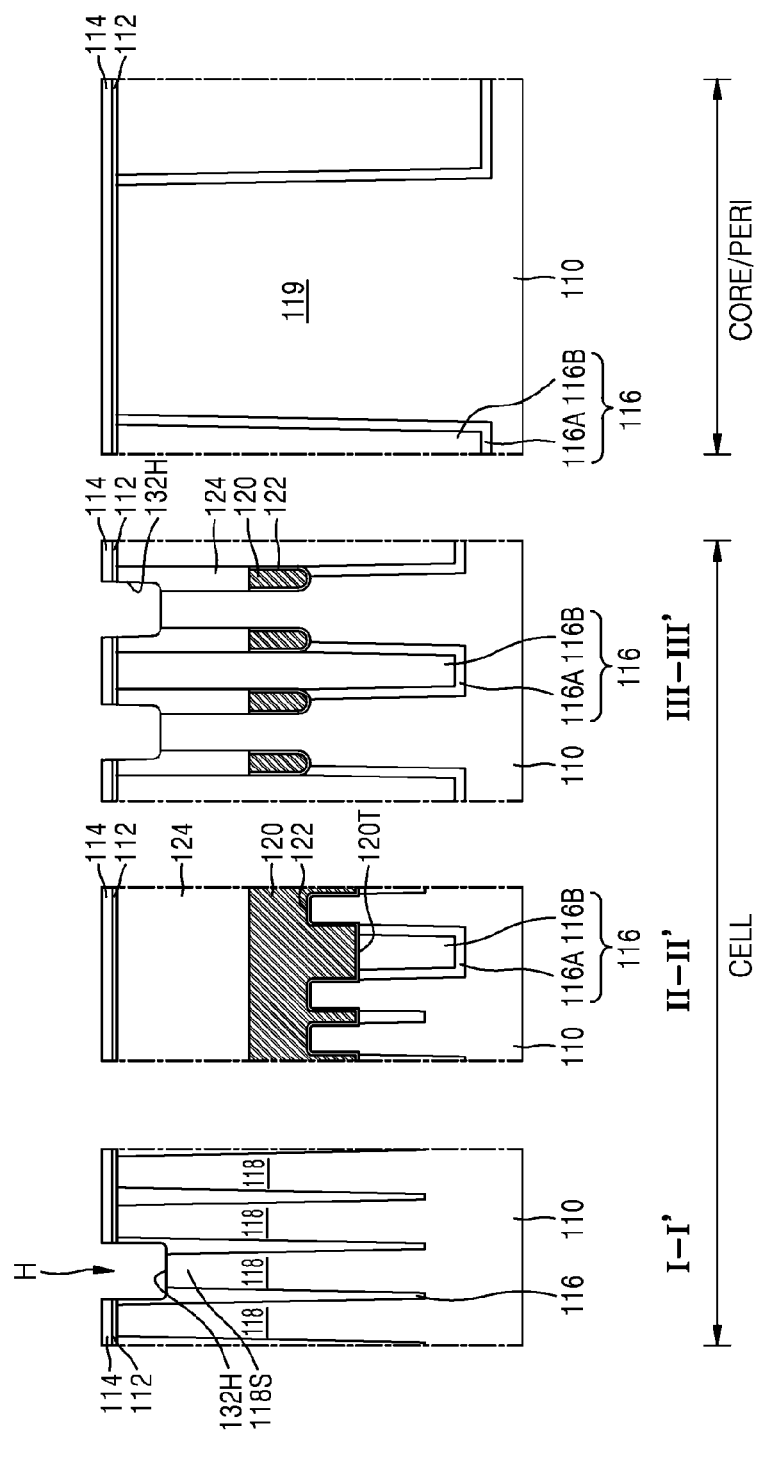
FIGS. 8 through 18 are cross-sectional views illustrating a method of manufacturing a semiconductor device, according to an example embodiment.

Referring to FIG. 8, isolation trenches are formed in the cell array region CELL and the peripheral circuit region CORE/PERI of a substrate 110, and isolation layers 116 are formed in the isolation trenches. Due to the isolation layers 116, active regions 118 may be defined in the cell array region CELL and an active region 119 may be defined in the peripheral circuit region CORE/PERI. Each, or at least one, of the isolation layers 116 may include a first isolation layer 116A and a second isolation layer 116B. The first isolation layer 116A and the second isolation layer 116B may include different materials. For example, the first isolation layer 116A may include an oxide layer, and the second isolation layer 116B may include a nitride layer. However, the structure of the isolation layers 116 is not limited to a double layer structure. For example, each, or at least one, of the isolation layers 116 may be a single layer including one type of insulating layer or a multi-layer including a combination of at least three types of insulating layers.

Word line trenches 120T are formed in the cell array region CELL of the substrate 110. The word line trenches 120T may extend substantially parallel to one another, and each, or at least one, of the word line trenches 120T may have a line shape that runs across the active regions 118. As illustrated in the cross-sectional view taken along the line II-II', step differences may be formed in the bottoms of the word line trenches 120T. The step differences may be formed by etching the isolation layers 116 and the substrate 100 through separate etching processes so that an etch depth for the isolation layers 116 is different from the etch depth for the substrate 110.

A gate insulating layer 122, a word line 120, and a buried insulating layer 124 are formed, for example, sequentially formed inside each, or inside at least one, of the word line trenches 120T.

In example embodiments, after word lines 120 are formed, impurity ions may be implanted into the substrate 110 at both sides of each, or at least one, of the word line 120 and thus source and drain regions may be formed in upper portions of the active regions 118. In other example embodiments, an impurity ion implantation process for forming the source and drain regions may be performed before the word lines 120 are formed. In example embodiments, the word lines 120 may include Ti, Ta, TaN, W, WN, TiSiN, WSiN, or a combination thereof.

The gate insulating layer 122 may include at least one of a silicon oxide layer, a silicon nitride layer, a silicon oxynitride layer, an oxide/nitride/oxide (ONO) layer, or a high-k dielectric layer having a higher dielectric constant than the silicon oxide layer. For example, the gate insulating layer 122 may have a dielectric constant of about 10 to 25. In example embodiments, the gate insulating layer 122 may include at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). For example, the gate insulating layer 122 may include $HfO_2$, $Al_2O_3$, $HfAlO_3$, $Ta_2O_3$, or $TiO_2$.

An upper surface of the buried insulating layer 124 may have substantially the same level as an upper surface of the substrate 110. Thus, the upper surface of the buried insulating layer 124 and the upper surface of the substrate 110 may form the same plane. The buried insulating layer 124 may include one of a silicon oxide layer, a silicon nitride layer, a silicon oxynitride layer, or a combination thereof.

A first buffer insulating layer pattern 112 and a second buffer insulating layer pattern 114 are formed, for example sequentially formed in the cell array region CELL and the peripheral circuit region CORE/PERI on the substrate 110. Each, or at least one, of the first buffer insulating layer pattern 112 and the second buffer insulating layer pattern 114 may include a silicon oxide layer, a silicon nitride layer, or a combination thereof. In example embodiments, the first buffer insulating layer pattern 112 may include a silicon oxide layer, and the second buffer insulating layer pattern 114 may include a silicon nitride layer.

Holes H may be formed in the first buffer insulating layer pattern 112 and the second buffer insulating layer pattern 114, and a portion of the upper surface of the substrate 110 may be exposed through the holes H. An upper portion of the substrate 110 exposed through the holes H may be etched, thereby forming direct contact holes 132H to expose source regions 118S of the active regions 118 of the cell array region CELL.

Referring to FIG. 9, a conductive layer is formed in the cell array region CELL and the peripheral circuit region CORE/PERI to fill the direct contact holes 132H and cover an upper surface of the second buffer insulating layer pattern 114. A portion of the conductive layer, which fills the direct contact holes 132H, may form a direct contact 132, and a portion of the conductive layer, which covers the second buffer insulating layer pattern 114, may form a first conductive layer 142AL.

The conductive layer may include, for example, silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof.

The conductive layer may be formed in a bottom-up manner or a top-down manner, as described above. For example, the conductive layer may be formed of or include polysilicon by using a deposition process, such as CVD or ALD. Since the depths of the direct contact holes 132H are relatively shallow, the conductive layer may completely fill the direct contact holes 132H without the occurrence of a void or a seam. Accordingly, the conductive layer filling the direct contact holes 132H may form the direct contact 132 having high reliability.

As described above, the conductive layer may form the direct contact 132 and the first conductive layer 142AL. To differentiate the direct contact 132 from the first conductive layer 142AL, a boundary between the direct contact 132 and the first conductive layer 142AL is represented by a dotted line. The dotted line may correspond to an upper surface 132T of the direct contact 132. Since the conductive layer is formed through a single process by using the same material, the direct contact 132 and the first conductive layer 142AL may not be physically differentiated from each other.

In example embodiments, the conductive layer may cover the upper surface of the second buffer insulating layer pattern 114 and have a thickness of about 100 Å to about 500 Å. For example, the conductive layer may cover the upper surface of the second buffer insulating layer pattern 114 and have a thickness of about 300 Å to about 400 Å. However, the thickness of the conductive layer covering the second buffer insulating layer pattern 114 is not limited thereto.

Referring to FIG. 10, a mask pattern 161 is formed on a resultant structure of the substrate 110 in the cell array region CELL and the peripheral circuit region CORE/PERI. The mask pattern 161 may cover only a portion of the first conductive layer 142AL of the peripheral circuit region CORE/PERI while completely covering the first conductive layer 142AL of the cell array region CELL. The mask pattern 161 may include a photo resist mask formed through a photolithograph process. In some cases, the mask pattern 161 may include a hard mask.

After the mask pattern 161 is formed, exposed portions of the first conductive layer 141AL in the peripheral circuit region CORE/PERI may be removed by using the mask pattern 161 to form dummy conductive layers 142D. After the dummy conductive layers 142D are formed, the upper surface of the second buffer insulating layer pattern 114 may be exposed between the dummy conductive layers 142D. A first space S1 between the dummy conductive layers 142D may be appropriately determined in consideration of a dishing phenomenon in a CMP process that is subsequently performed. For example, the first space S1 may be equal to or less than 4.8 μm so that a dishing depth becomes equal to or less than 150 Å. However, the first space S1 is not limited thereto. The width of the dummy conductive layer 142D (see the width Wd of the dummy pattern Dp) may be appropriately selected from a range of widths that do not increase process difficulty, for example, the difficulty of a photolithography process.

Figure 11:
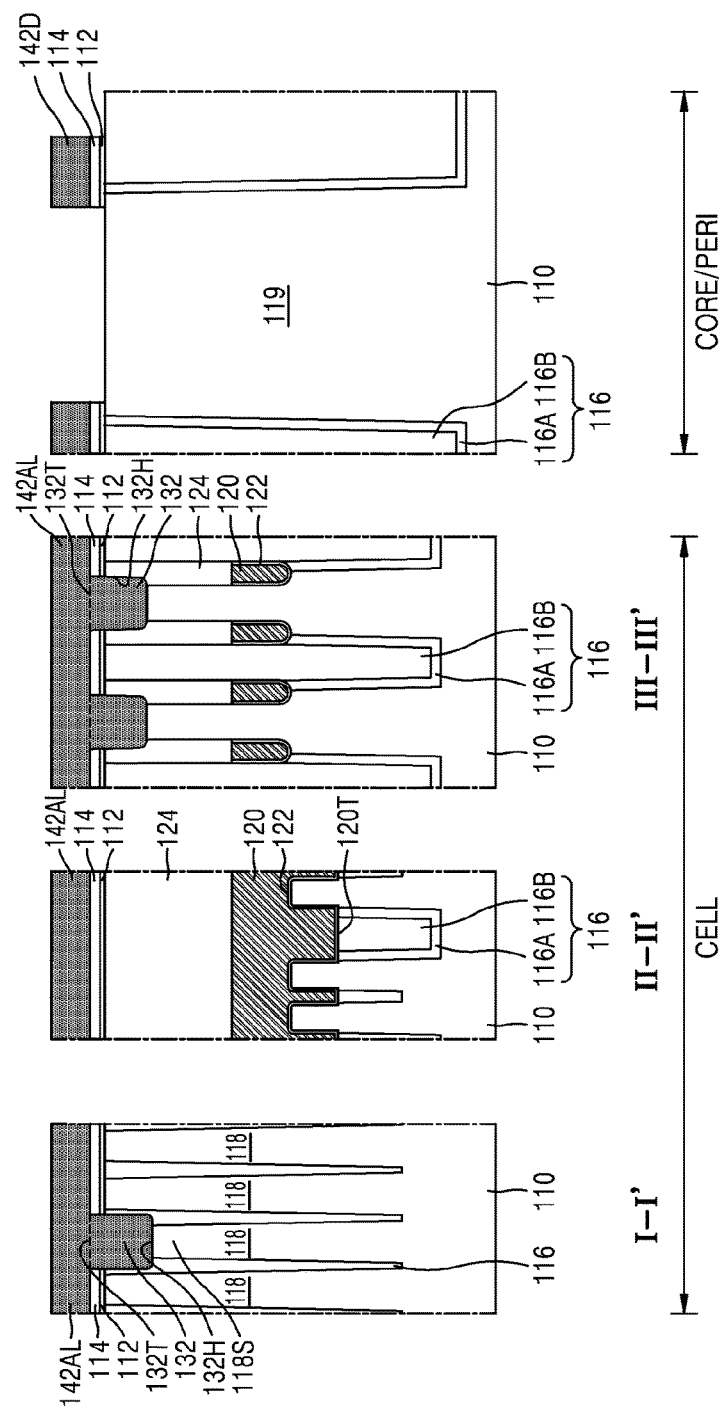

Referring to FIG. 11, after the dummy conductive layers 142D are formed in the peripheral circuit region CORE/PERI, the second buffer insulating layer pattern 114 exposed between the dummy conductive layers 142D and the first buffer insulating layer pattern 112 under the second buffer insulating layer pattern 114 are removed. As the second buffer insulating layer pattern 114 and the first buffer insulating layer pattern 112 thereunder are removed, an upper surface of the active region 119 and/or an upper surface of the isolation layer 116 may be exposed between the dummy conductive layers 142D.

The second buffer insulating layer pattern 114 and the first buffer insulating layer pattern 112 may be removed through a dry or wet etching process by using the mask pattern 161 and the dummy conductive layers 142D as an etch mask. For example, the second buffer insulating layer pattern 114 and the first buffer insulating layer pattern 112 may be removed through a wet etching process. As not illustrated in the drawings, when the second buffer insulating layer pattern 114 and the first buffer insulating layer pattern 112 are removed through a wet etching process, a portion of the second buffer insulating layer pattern 114 and a portion of the first buffer insulating layer pattern 112 under the dummy conductive layers 142D may be etched, thereby forming a structure recessed inward. After the second buffer insulating layer pattern 114 and the first buffer insulating layer pattern 112 are removed, the mask pattern 161 may be removed.

Referring to FIG. 12, a gate insulating layer 140G' and a first gate conductive layer 142AG' are formed, for example sequentially formed on a resultant structure of the substrate 110 in the cell array region CELL and the peripheral circuit region CORE/PERI. The gate insulating layer 140G' and the first gate conductive layer 142AG' may cover the first conductive layer 142AL in the cell array region CELL, and may cover the dummy conductive layers 142D, an exposed upper surface of the active region 119 and an exposed upper surface of the isolation layer 116 in the peripheral circuit region CORE/PERI.

The gate insulating layer 140G' may be a silicon oxide layer, a silicon nitride layer, a silicon oxynitride layer, or a combination thereof. The first gate conductive layer 142AG' may include polysilicon, semiconductor material doped with impurities, metal, conductive metal nitride, or metal silicide. For example, in the method of manufacturing a semiconductor device, according to the example embodiment, the first gate conductive layer 142AG' may include polysilicon. The gate insulating layer 140G' and the first gate conductive layer 142AG' may be formed by using a CVD or ALD process.

As the dummy conductive layers 142D are formed in the peripheral circuit region CORE/PERI, an upper surface of the first gate conductive layer 142AG' in the peripheral circuit region CORE/PERI may have a step difference. In other words, an upper surface of the first gate conductive layer 142AG' which is disposed on the dummy conductive layers 142D may be higher than an upper surface of the first gate conductive layer 142AG' which is disposed on the active region 119 and the isolation layer 116.

Referring to FIG. 13, a sacrificial layer 171 is formed on a resultant structure of the substrate in the cell array region CELL and the peripheral circuit region CORE/PERI. The sacrificial layer 171 is a material layer for planarization and may include a material having relatively high etch selectivity with respect to the first gate conductive layer 142AG' under the sacrificial layer 171. For example, when the first gate conductive layer 142AG' includes polysilicon, the sacrificial layer 171 may include an oxide layer. For example, the sacrificial layer 171 may include a low density (LD)-TEOS oxide layer. However, the sacrificial layer 171 is not limited to the oxide layer or the LD-TEOS oxide layer.

A height of the sacrificial layer 171 may be greater than or equal to twice the height of a step difference portion of the first gate conductive layer 142AG' for the purpose of planarization. For example, when a step difference portion of the first gate conductive layer 142AG' has a thickness of about 300 Å to about 400 Å due to the dummy conductive layers 142D, the sacrificial layer 171 may have a thickness of about 800 Å or more.

Referring to FIG. 14, planarization is performed on the sacrificial layer 171 by using a CMP process. The planarization may be performed through the CMP process until an upper surface of the first gate conductive layer 142AG" is exposed. However, as illustrated in FIG. 14, since a recessed portion is present in the first gate conductive layer 142AG' of the peripheral circuit region CORE/PERI, a portion of the sacrificial layer 171A may remain in the recessed portion and reduce or prevent the first gate conductive layer 142AG' of the recessed portion from being exposed.

More specifically, during the CMP process, the first gate conductive layer 142AG' may serve as a CMP stopping layer. However, the first gate conductive layer 142AG' of the peripheral circuit region CORE/PERI forms a portion of a gate electrode structure (for example, the gate electrode structure 242 of FIG. 3A), and thus has to be protected by the sacrificial layer 171 without being exposed during the CMP process. In general, the peripheral circuit region CORE/PERI has a very large area and a very large space, as described above, and thus, when the first gate conductive layer 142AG' and the sacrificial layer 171 are formed without the dummy conductive layers 142D and a CMP process is performed, the first gate conductive layer 142AG' may be exposed and damaged due to a dishing phenomenon.

However, in the method of manufacturing a semiconductor device according to the example embodiment, the dummy conductive layers 142D are formed and a dishing phenomenon may be reduced or prevented during a CMP process by using the dummy conductive layers 142D. In particular, as a portion (i.e., a portion of the first gate conductive pattern 142AG of FIG. 3A) of the first gate conductive layer 142AG', which is used in the gate electrode structure 242, is not exposed during a CMP process, a reliable gate electrode structure may be implemented. For example, as the dummy conductive layers 142D are disposed so that a portion of the first gate conductive layer 142AG', which corresponds to a portion of the first gate conductive pattern 142AG of FIG. 3A, is placed between the dummy conductive layers 142D, and then a CMP process is performed, the portion of the first gate conductive layer 142AG' may not be damaged during the CMP process.

After planarization is performed through, for example, the CMP process, the thickness of the first gate conductive layer 142AG' may be smaller than the thickness of the first gate conductive layer 142AG' before the CMP process is performed. In some cases, by accurately controlling the CMP process, the thickness of the first gate conductive layer 142AG' may be maintained to be substantially equal to the thickness of the first gate conductive layer 142AG' before the CMP process is performed.

Figure 15:
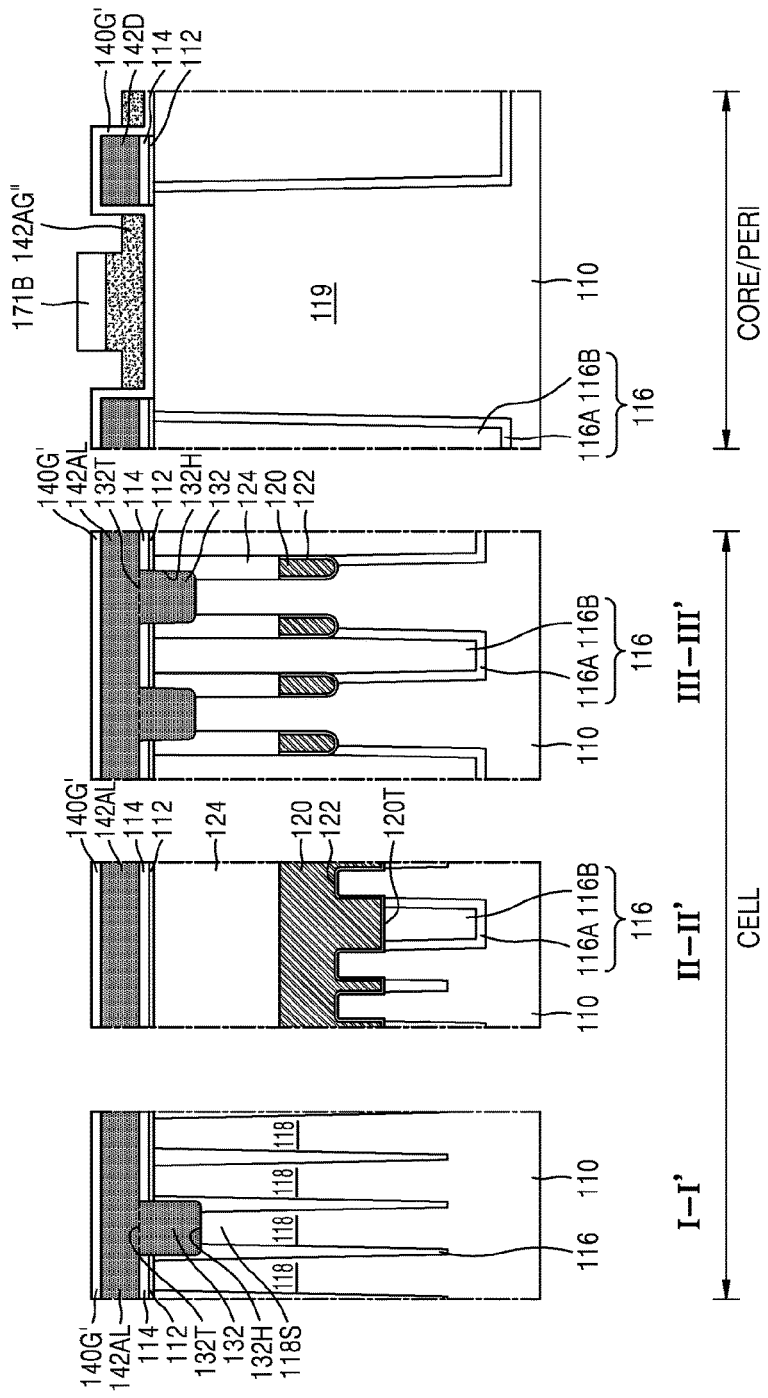

Referring to FIG. 15, the first gate conductive layer 142AG' is removed by using a remaining sacrificial layer 171B as an etch mask. The entire gate insulating layer 140G' of the cell array region CELL may be exposed through the removal of the first gate conductive layer 142AG'. In addition, in the peripheral circuit region CORE/PERI, the gate insulating layer 140G' on upper surfaces and portions of side surfaces of the dummy conductive layers 142D may be exposed.

The first gate conductive layers 142AG" may remain under the sacrificial layer 171B and in a region adjacent a side surface thereof. Subsequently, each, or at least one, of the remaining first gate conductive layers 142AG" may form the first gate conductive pattern 142AG of each, or at least one, of the gate electrode structures (for example, the gate electrode structure 242 of FIG. 3A). The first gate conductive layer 142AG' may be removed, for example, through an etch-back process. After the etch-back process is performed, the gate insulating layer 140G under the first gate conductive layer 142AG' may also be etched to some degree and thus may become thin.

Figure 16:
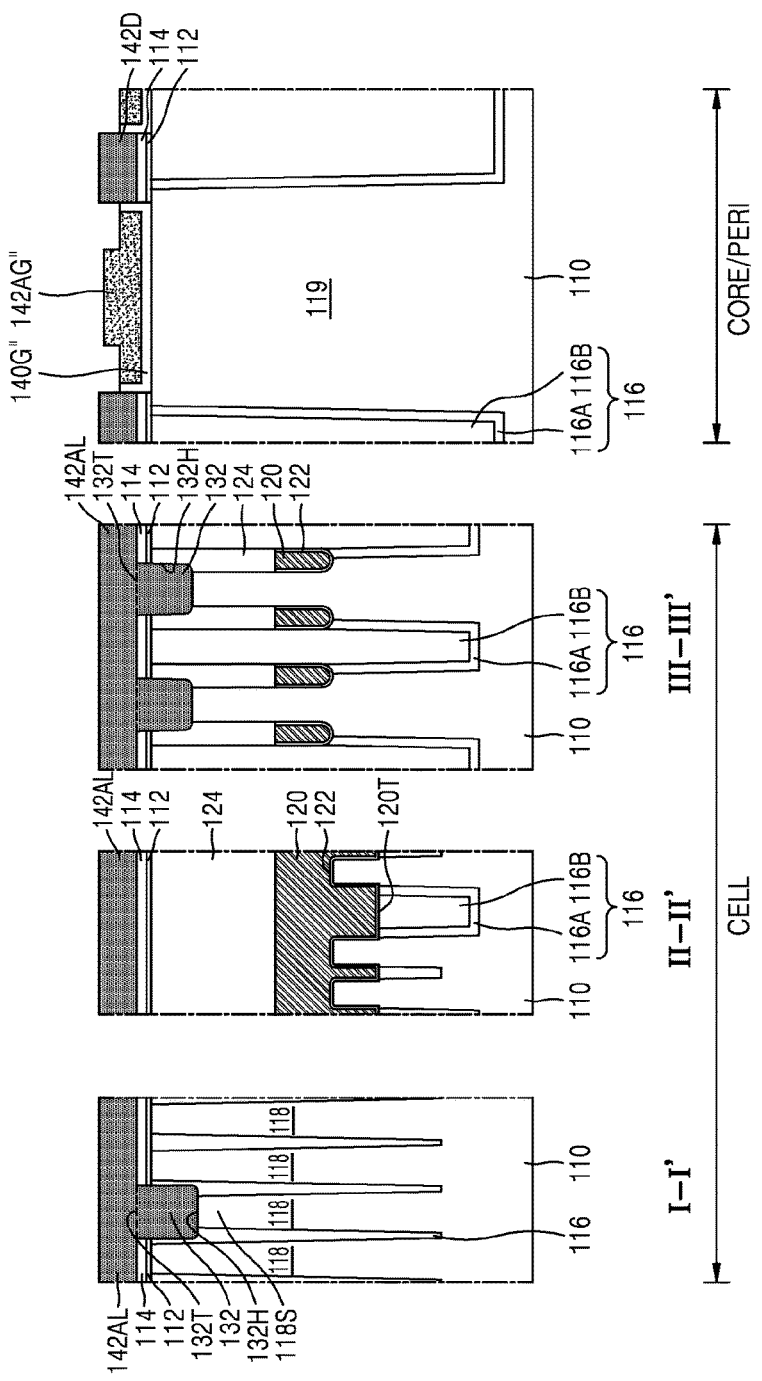

Referring to FIG. 16, after the gate conductive layer 142AG' is removed, the gate insulating layer 140G' and the sacrificial layer 171B are removed. The entire first conductive layer 142AL of the cell array region CELL may be exposed through the removal of the gate insulating layer 140G' and the sacrificial layer 171B. In addition, in the peripheral circuit region CORE/PERI, the upper surfaces of the dummy conductive layers 142D and portions of the side surfaces thereof may be exposed, and the upper surfaces of the remaining first gate conductive layers 142AG" may be exposed.

Both the gate insulating layer 140G and the sacrificial layer 171B may include, for example, an oxide-based material. Accordingly, the gate insulating layer 140G and the sacrificial layer 171B may be removed through a wet etching process using a hydrofluoric acid (HF) solution.

Figure 17:
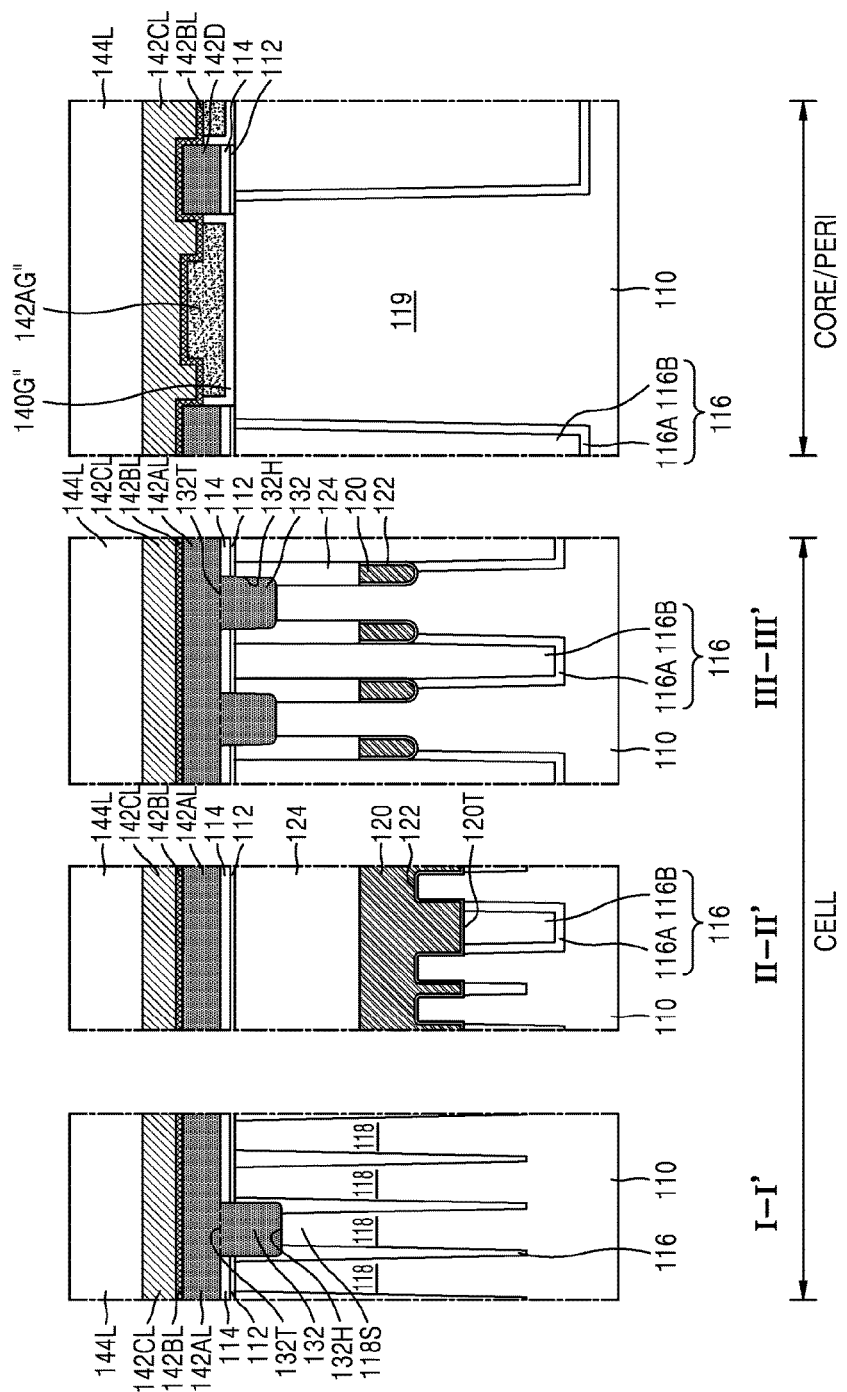

Referring to FIG. 17, a second conductive layer 142BL and a third conductive layer 142CL are formed, for example sequentially formed, on a resultant structure of the substrate 110 in the cell array region CELL and the peripheral circuit region CORE/PERI, and an insulating layer 144L is formed on the third conductive layer 142CL.

In example embodiments, the second conductive layer 142BL may include titanium nitride (TiN), and the third conductive layer 142CL may include tungsten (W). However, the second conductive layer 142BL and the third conductive layer 142CL are not limited thereto. The insulating layer 144L may include, for example, a silicon oxide layer, a silicon nitride layer, or a combination thereof.

Figure 18:
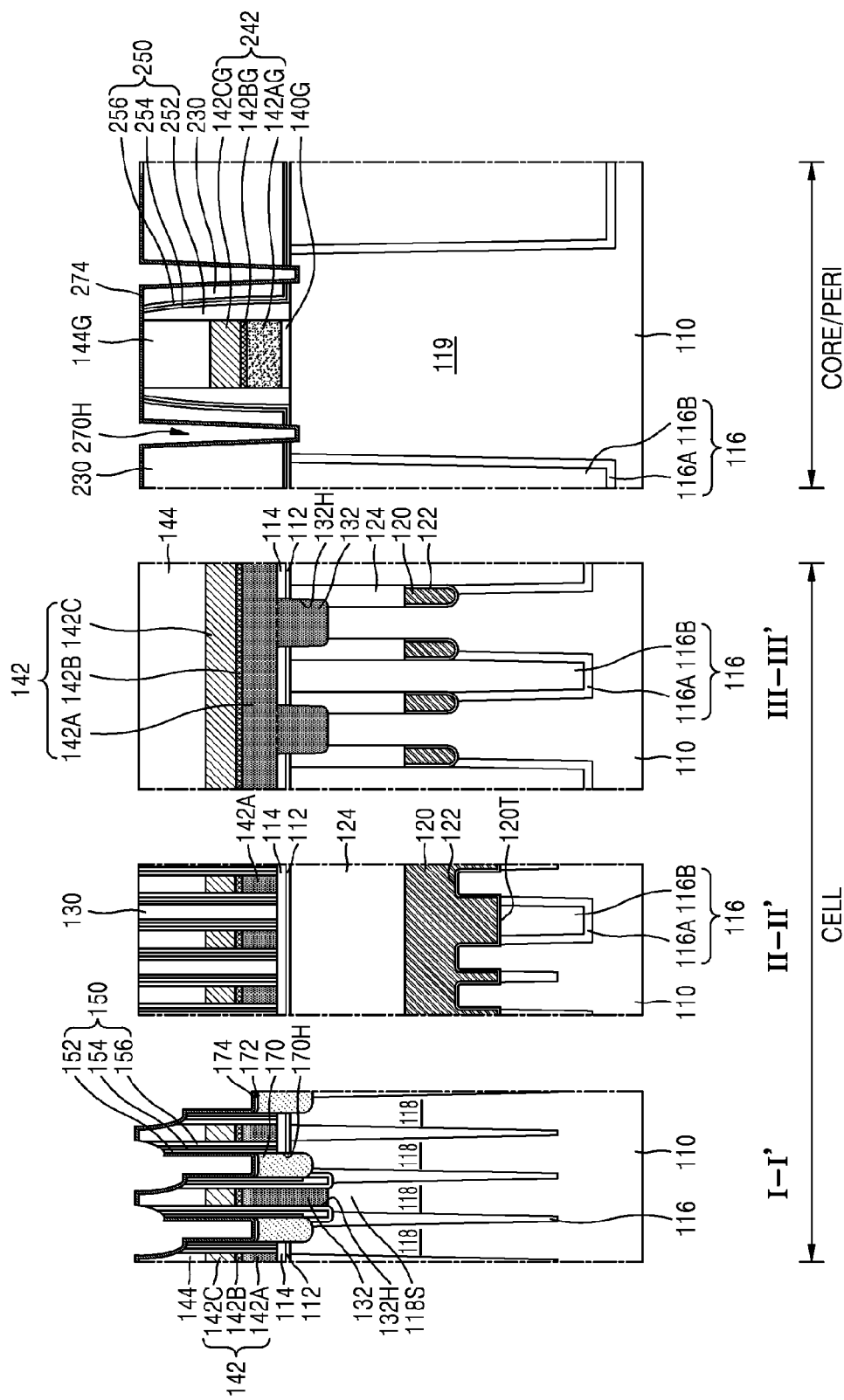

Referring to FIG. 18, in the cell array region CELL, the first conductive layer 142AL, the second conductive layer 142BL, the third conductive layer 142CL, and the insulating layer 144L are patterned, thereby forming bit lines 142 each including a first conductive pattern 142A, a second conductive pattern 142B, and a third conductive pattern 142C and insulating capping lines 144 covering the bit lines 142. In the peripheral circuit region CORE/PERI, the gate insulating layer 140G", the first gate conductive layer 142AG", the second conductive layer 142BL, the third conductive layer 142CL, and the insulating layer 144L are patterned, thereby forming a gate insulating layer 140G, a gate electrode structure 242 including a first gate conductive pattern 142AG, a second gate conductive pattern 142BG, and a third gate conductive pattern 142CG and an insulating capping line 144G for a peripheral circuit which covers the gate electrode structure 242. Portions corresponding to the dummy conductive layers 142D around the gate electrode structure 242 may be removed by patterning.

Thereafter, insulating spacer structures 150 are formed to cover both sidewalls of the bit lines 142 and the insulating capping lines 144 in the cell array region CELL. Each, or at least one, of the insulating spacer structures 150 may include a first insulating spacer 152, a second insulating spacer 154, and a third insulating spacer 156.

Insulating patterns 130 are formed in spaces defined by the insulating spacer structures 150 between the bit line structures 140, and define buried contact holes 170H. Buried contacts 170 are formed to fill the buried contact holes 170H. The buried contact holes 170H may be formed to expose the active regions 118. The buried contacts 170 may be formed by using a CVD process, a physical vapor deposition (PVD) process, or a silicon epitaxial growth process. The buried contacts 170 may include a semiconductor material doped with impurities, a metal, a conductive metal nitride, or a metal silicide, but is not limited thereto.

Thereafter, the insulating capping lines 144, the insulating spacer structures 150, and the insulating patterns 130 are at least partially etched, and metal silicide layers 172 are formed on exposed portions of upper surfaces of the buried contacts 170. Conductive barrier layers 174 are formed to cover upper surfaces of the metal silicide layers 172, portions of upper surfaces of the insulating capping lines 144, and portions of the insulating spacer structures 150. The metal silicide layers 172 may include cobalt silicide (CoSix), nickel silicide (NiSix), or manganese silicide (MnSix), but are not limited thereto. The conductive barrier layers 174 may include a metal-containing conductive material. For example, the conductive barrier layers 174 may have a Ti/TiN stack structure.

The process of forming the gate electrode structures 242 and the gate insulating capping lines 144G in the peripheral circuit region CORE/PERI may be performed simultaneously or contemporaneously with the process of forming the bit lines 142 and the insulating capping lines 144 in the cell array region CELL.

In the peripheral circuit region CORE/PERI, insulating spacer structures 250 are formed to cover sidewalls of the gate electrode structures 242 and the insulating capping lines 144G. Each of the insulating spacer structures 250 may include a first insulating spacer 252, a second insulating spacer 254, and a third insulating spacer 256. The first insulating spacer 252, the second insulating spacer 254, and the third insulating spacer 256 formed in the peripheral circuit region CORE/PERI may be respectively formed of or include the same material at the same time as the first insulating spacer 152, the second insulating spacer 154, and the third insulating spacer 156 formed in the cell array region CELL.

In the peripheral circuit region CORE/PERI, an insulating layer 230 may be formed around the gate electrode structures 242, the insulating capping lines 144G, and the insulating spacer structures 250. The insulating layer 230 may include a silicon oxide layer, a silicon nitride layer, or a combination thereof.

A mask pattern (not shown) is formed on the insulating layer 230 of the peripheral circuit region CORE/PERI to cover the insulating layer 230 except for regions in which contact holes 270H will be formed. And a portion of the insulating layer 230 is etched by using the mask pattern as an etch mask, thereby forming the contact holes 270H. The active region 119 may be exposed through the contact holes 270H. The process of forming the contact holes 270H may be performed simultaneously or contemporaneously with the process of forming the buried contact holes 170H of the cell array region CELL.

Conductive barrier layers 274 are formed to cover inner walls of the contact holes 270H. The process of forming the conductive barrier layers 274 may be performed simultaneously or contemporaneously with the process of forming the conductive barrier layers 174 of the cell array region CELL. The conductive barrier layers 274 may include the same material as the conductive barrier layers 174 of the cell array region CELL.

Thereafter, the landing pads 180 (see FIG. 2) are formed on the conductive barrier layers 174 in the cell array region CELL. The landing pads 180 may be electrically connected to the buried contacts 170 and extend from the insides of the buried contact holes 170H up to an upper portion of the bit line structures 140 to vertically overlap the bit line structures 140.

In the peripheral circuit region CORE/PERI, a conductive material may be deposited on the conductive barrier layers 274 to form the conductive lines 280 (see FIG. 3A). The landing pads 180 of the cell array region CELL and the conductive lines 280 of the peripheral circuit region CORE/PERI may be simultaneously or contemporaneously formed of, or may or contemporaneously include, the same material. The landing pads 180 and the conductive lines 280 may be formed by using a CVD process or a PVD process. In example embodiments, the landing pads 180 and the conductive lines 280 may include a metal, a metal nitride, conductive polysilicon, or a combination thereof. For example, the landing pads 180 and the conductive lines 280 may include tungsten (W). When the landing pads 180 and the conductive lines 280 are formed, the formation of the semiconductor device 100 of FIGS. 2 and 3A may be completed.

As described above with respect to the semiconductor device 100 of FIG. 3A, in the peripheral circuit region CORE/PERI, a dummy conductive layer 142D may be present in a position that is far away from the gate electrode structure 242.

Figure 19:
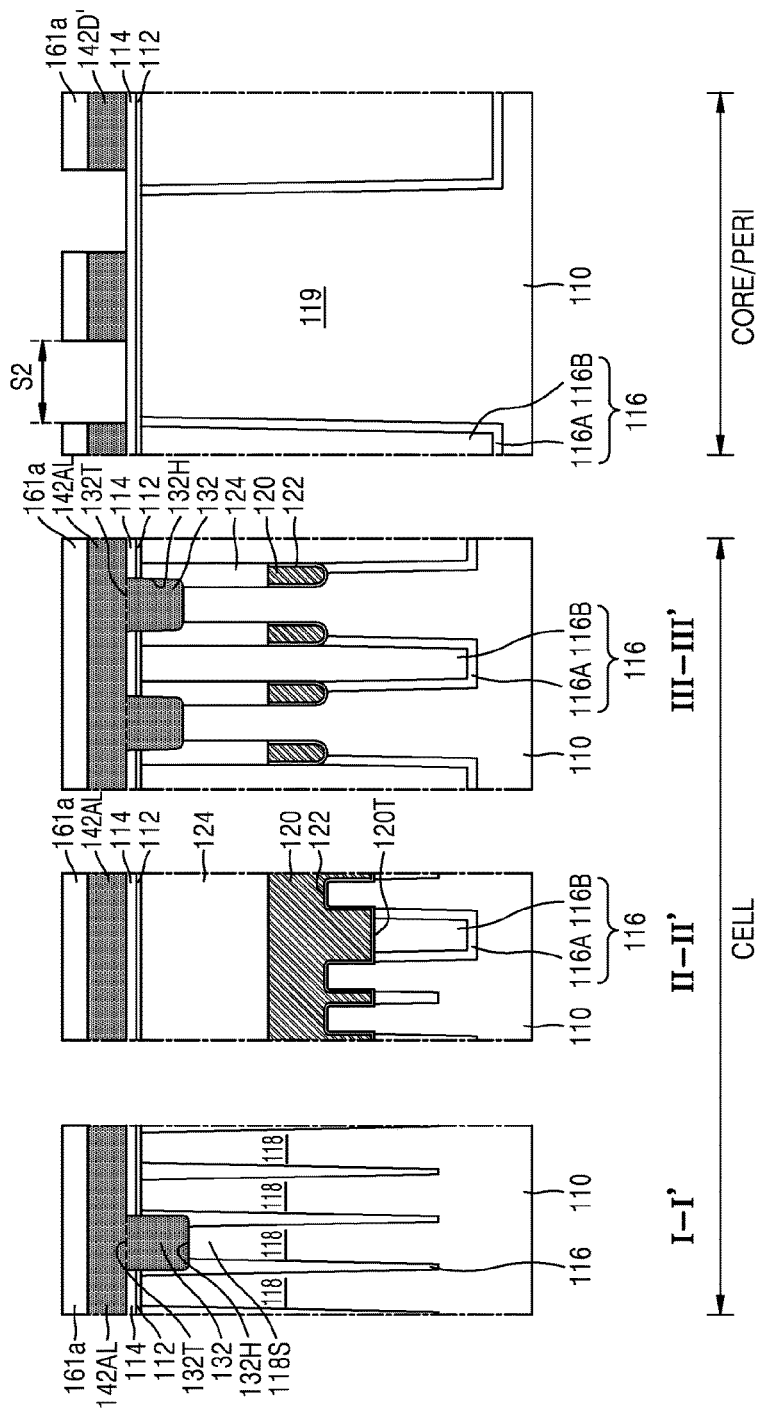
FIG. 19 is a cross-sectional view illustrating a method of manufacturing a semiconductor device, according to an example embodiment.

FIG. 19 is a cross-sectional view illustrating a method of manufacturing a semiconductor device, according to an example embodiment of the inventive concepts. The cross-sectional view of FIG. 19 corresponds to the cross-sectional view of FIG. 10. Content described above with reference to FIGS. 8 through 18 will be briefly described or omitted.

Referring to FIG. 19, as described with reference to FIGS. 8 and 9, a direct contact 132 and a first conductive layer 142AL are formed in a cell array region CELL and the first conductive layer 142AL is formed in a peripheral circuit region CORE/PERI. Thereafter, a mask pattern 161*a* is formed on a resultant structure of a substrate 110 in the cell array region CELL and the peripheral circuit region CORE/PERI. The mask pattern 161*a* may cover only a portion of the first conductive layer 142AL of the peripheral circuit region CORE/PERI while completely covering the first conductive layer 142AL of the cell array region CELL, similar to or the same as the mask pattern 161 of FIG. 10.

In the peripheral circuit region CORE/PERI, the width of the first conductive layer 142AL that is exposed through the mask pattern 161*a* may be different from the width of the first conductive layer 142AL that is exposed through the mask pattern 161 of FIG. 10. Accordingly, an arrangement structure of dummy conductive layers 142D' formed by the mask pattern 161*a* may be different from the arrangement structure of the dummy conductive layers 142D of FIG. 10. Specifically, a second space S2 between the dummy conductive layers 142D' of FIG. 19 may be smaller than the first space S1 between the dummy conductive layers 142D of FIG. 10.

In particular, in the method of manufacturing a semiconductor device, according to the example embodiment, some of the dummy conductive layers 142D may be disposed in a position corresponding to the first gate conductive pattern 142DG of the gate electrode structure 242*a* of FIG. 3B. Accordingly, when subsequent processes as described with reference to FIGS. 11 through 18 are performed, a dummy conductive layers 142D' may form the first gate conductive pattern 142DG of the gate electrode structure 242*a* of FIG. 3B. For example, in FIG. 19, a dummy conductive layer 142D' disposed on an active region 119 may subsequently form the first gate conductive pattern 142DG of the gate electrode structure 242*a* of FIG. 3B.

Figure 20:
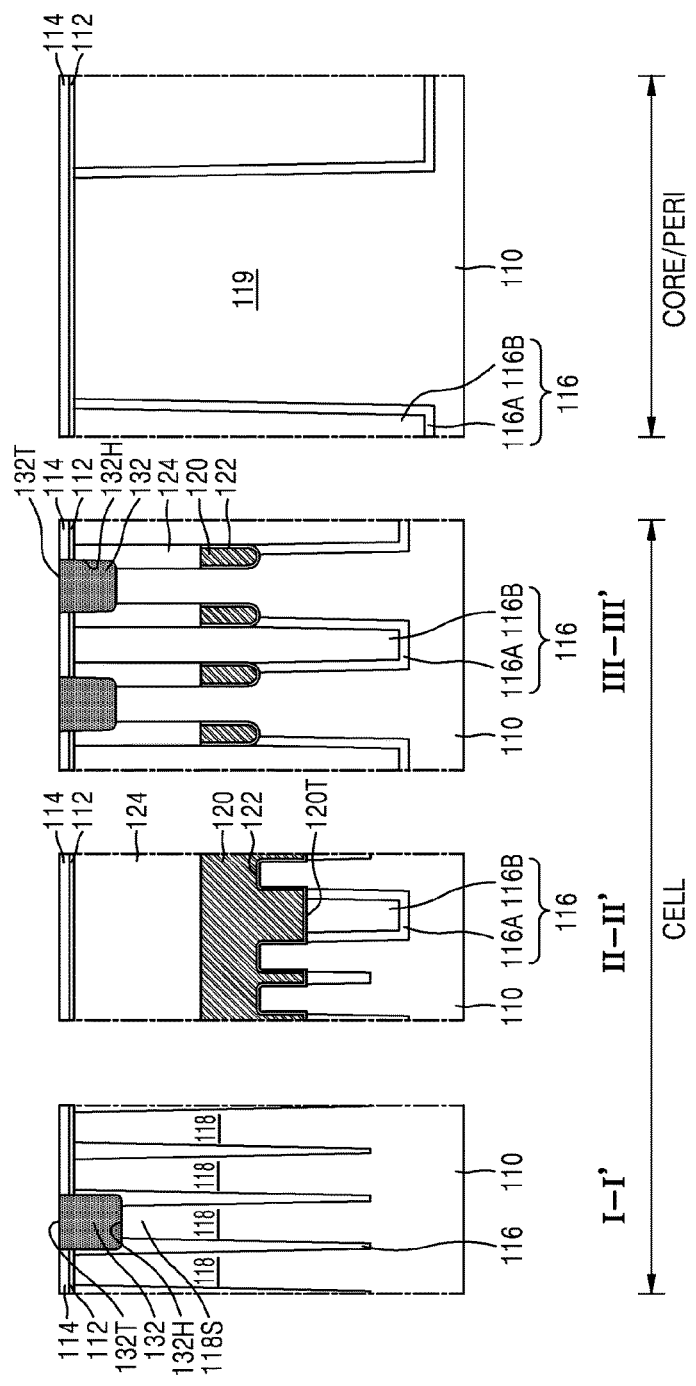
FIGS. 20 through 22 are cross-sectional views illustrating a method of manufacturing a semiconductor device, according to an example embodiment.
Figure 21:
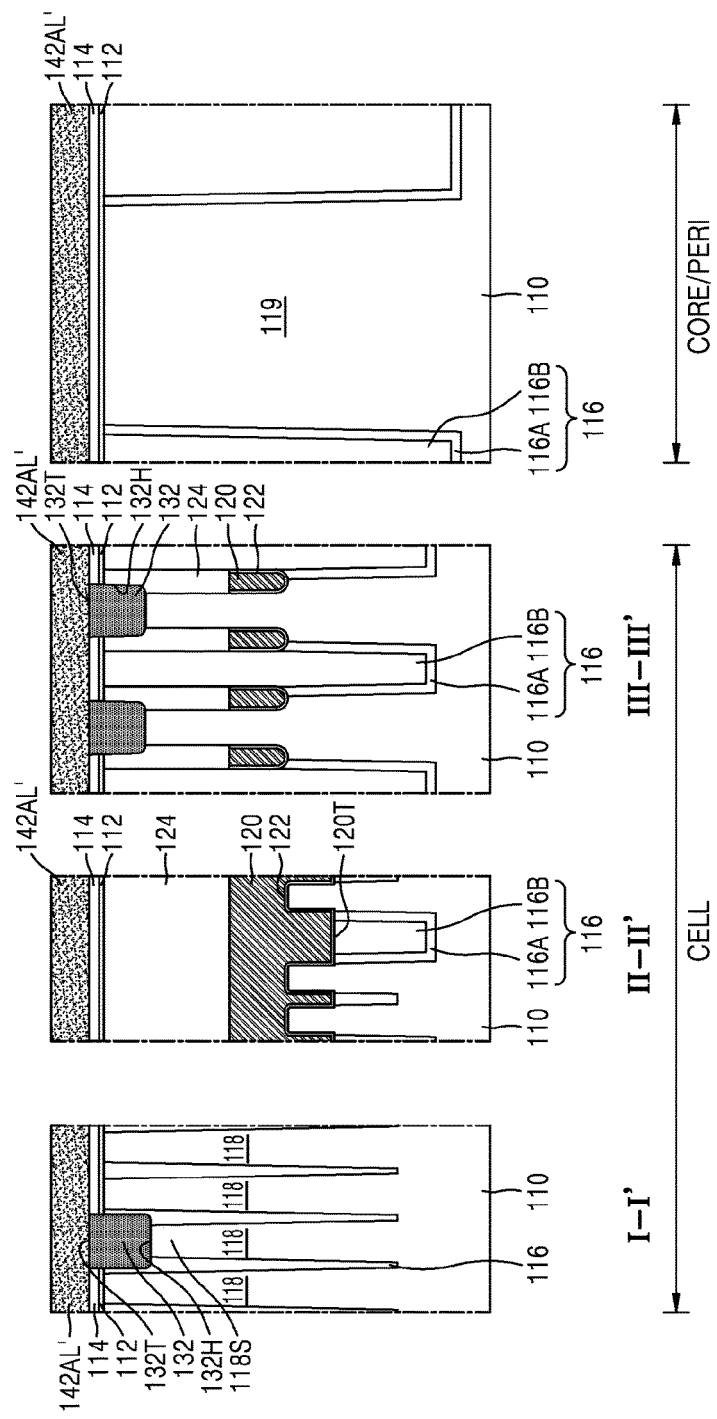
Figure 22:
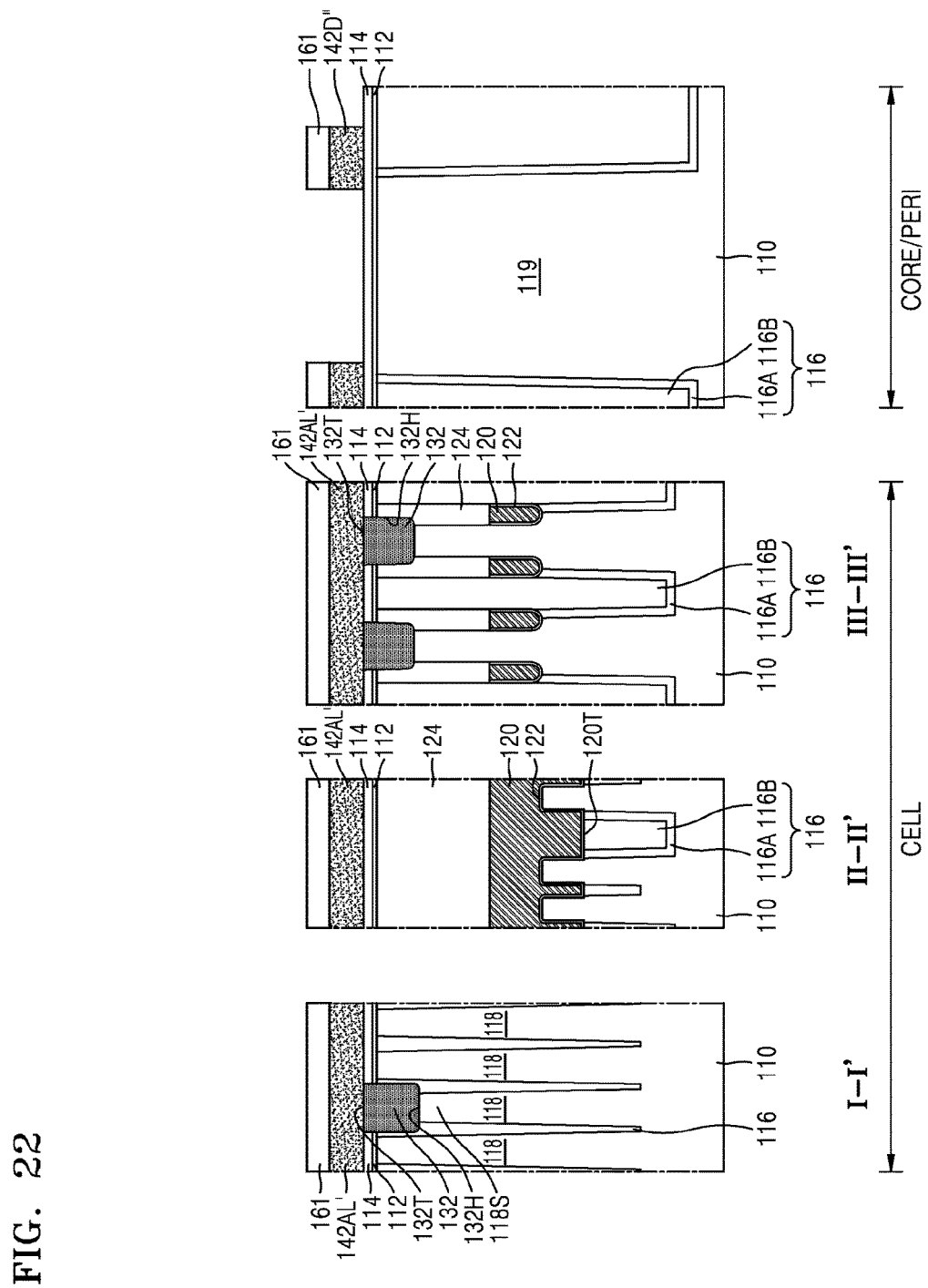

FIGS. 20 through 22 are cross-sectional views illustrating a method of manufacturing a semiconductor device, according to an example embodiment of the inventive concepts, and correspond to FIGS. 9 and 10. Subject matter described above with reference to FIGS. 8 through 18 will be briefly described or omitted.

Referring to FIG. 20, as described above with reference to FIG. 8, direct contact holes 132H are formed in a cell array region CELL. Thereafter, the direct contact holes 132H are filled with a conductive material, thereby forming a plurality of direct contact holes 132. The direct contacts 132 may be formed by using a method of forming the conductive layer of FIG. 9, and may include the same material as the conductive layer.

In an example embodiment, since the first conductive layer is not formed and only the direct contacts 132 are formed, an additional process such as a planarization process may be required. For example, the direct contact holes 132H are filled with an amount of a conductive material sufficient to fill the direct contact holes 132H, the conductive material may be planarized so that an upper surface of a second buffer insulating layer pattern 114 is exposed. Accordingly, direct contacts 132 may be formed in the direct contact holes 132H, and an upper surface 132T of each of the direct contacts 132 may form the same plane as an upper surface of the second buffer insulating layer pattern 114.

Referring to FIG. 21, a first conductive layer 142AL', is formed on a resultant structure of the substrate 110 in the cell array region CELL and a peripheral circuit region CORE/PERI. The first conductive layer 142AL' may cover an upper surface of the second buffer insulating layer pattern 114 and upper surfaces of the direct contacts 132 in the cell array region CELL, and may cover the upper surface of the second buffer insulating layer pattern 114 in the peripheral circuit region CORE/PERI.

The first conductive layer 142AL' may include conductive polysilicon, a semiconductor material doped with impurities, a metal, a conductive metal nitride, or a metal silicide. The first conductive layer 142AL' may be formed, for example, by using a CVD or ALD process.

When the first conductive layer 142AL' is formed, a structure similar to or the same as the structure shown in FIG. 9 may be implemented. The direct contact 132 and the first conductive layer 142AL of FIG. 21 respectively include different conductive layers, and each of the conductive layers may include different materials. However, the direct contacts 132 and the first conductive layer 142AL' of FIG. 9 may include the same conductive layer. In some cases, the direct contacts 132 and the first conductive layer 142AL' of FIG. 21 may include the same conductive layer including the same material. When the direct contact 132 and the first conductive layer 142AL' include the same conductive layer, the structure of FIG. 21 may be substantially the same as the structure of FIG. 9. However, the structure of FIG. 21 and the structure of FIG. 9 may have a difference in a manufacturing process. For example, the structure of FIG. 21 may be formed using at least two processes, whereas the structure of FIG. 9 may be formed using one process.

Referring to FIG. 22, a mask pattern 161 is formed on a resultant structure of the substrate 110 in the cell array region CELL and the peripheral circuit region CORE/PERI, similar to or the same as in FIG. 10, and dummy conductive layers 142D" are formed by using the mask pattern 161. Although the dummy conductive layers 142D of FIG. 10 includes the first conductive layer 142AL including the same material as the direct contact 132, the dummy conductive layers 142D" of FIG. 22 may include the first conductive layer 142AL' including a different material than the direct contact 132.

Thereafter, when subsequent processes as described above with reference to FIGS. 11 through 18 are performed, the semiconductor device 100*c* of FIG. 4 may be implemented.

Figure 23:
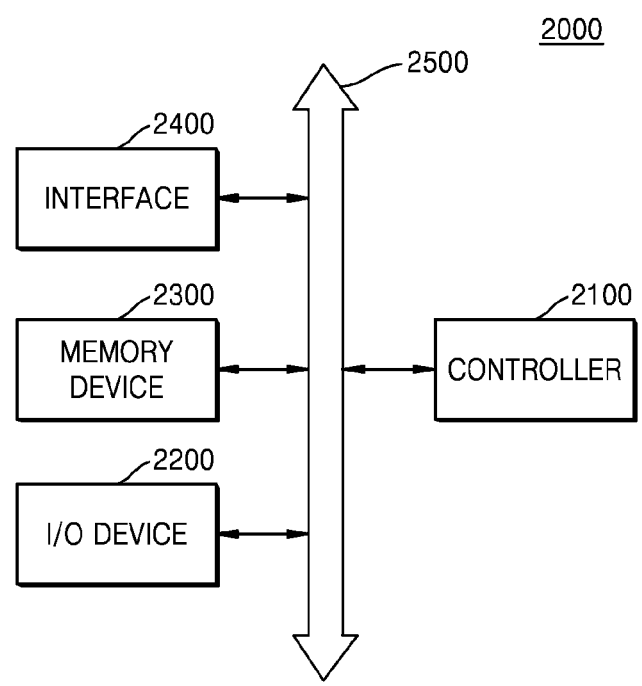
FIG. 23 is a block diagram of a system including a semiconductor device, according to an example embodiment.

FIG. 23 is a block diagram of a system 2000 including a semiconductor device according to an example embodiment of the inventive concepts.

Referring to FIG. 23, the system 2000 may include a controller 2100, an input/output (I/O) device 2200, a memory device 2300, and an interface 2400. The system 2000 may be a mobile system or a system configured to transmit or receive information. In some embodiments, the mobile system may be a personal digital assistant (PDA), a portable computer, a web tablet, a wireless phone, a mobile phone, a digital music player, or a memory card. The controller 2100 may be configured to control an execution program in the system 2000 and include a microprocessor, a digital signal processor, a microcontroller, or devices similar or the same thereto. The I/O device 2200 may be used to input or output data of the system 2000. The system 2000 may be connected to an external device (e.g., a personal computer (PC) or a network) using the I/O device 2200 and exchange data with the external device. The I/O device 2200 may be, for example, a keypad, a keyboard, or a display device.

The memory device 2300 may store codes and/or data for operations of the controller 2100 or store data processed by the controller 2100. The memory device 2300 may include at least one of the semiconductor devices 100, 100a, 100b, and 100c described with reference to FIGS. 1 through 22 according to the example embodiments of the inventive concepts or at least one of modified or changed semiconductor devices thereof within the spirit and scope of the inventive concepts.

The interface 2400 may be a data transmission path between the system 2000 and another external device. The controller 2100, the I/O device 2200, the memory device 2300, and the interface 2400 may communicate with one another through a bus 2500. The system 2000 may be used for a mobile phone, an MPEG-1 audio layer 3 (MP3) player, a navigation device, a portable multimedia player (PMP), a solid-state disk (SSD), or household appliances.

Figure 24:
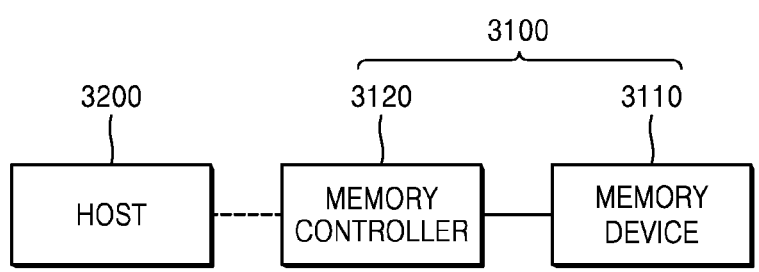
FIG. 24 is a block diagram of a memory card including a semiconductor device, according to an example embodiment.

FIG. 24 is a block diagram of a memory card 3100 including a semiconductor device according to an example embodiment of the inventive concepts.

Referring to FIG. 24, the memory card 3100 may include a memory device 3110 and a memory controller 3120.

The memory device 3110 may store data. In some embodiments, the memory device 3110 may be a non-volatile device capable of retaining stored data even if power supply is interrupted. The memory device 3110 may include at least one of the semiconductor devices 100, 100a, 100b, and 100c described with reference to FIGS. 1 to 22 according to the example embodiments of the inventive concepts or at least one of modified or changed semiconductor devices thereof within the spirit and scope of the inventive concepts.

The memory controller 3120 may read data stored in the memory device 3110 or store data in the memory device 3110 in response to read/write requests of a host 3200. The memory controller 3120 may include at least one of the semiconductor devices 100, 100a, 100b, and 100c described with reference to FIGS. 1 through 22 according to the example embodiments of the inventive concepts or at least one of modified or changed semiconductor devices thereof within the spirit and scope of the inventive concepts.

While the inventive concepts has been particularly shown and described with reference to example embodiments thereof it will be understood that various changes in form and details may be made therein without departing from the spirit and scope of the following claims.

What is claimed is:

1. A semiconductor device comprising:
   a substrate including a cell array region and a peripheral circuit region, the cell array region including a first active region defined by a first isolation layer, and the peripheral circuit region including a second active region defined by a second isolation layer;
   a first insulating layer on the substrate, in the cell array region, the first insulating layer including contact holes exposing the first active region;
   a direct contact in at least one of the contact holes in the cell array region, wherein the direct contact is connected to the first active region and is buried in the substrate;
   a bit line connected to the direct contact in the cell array region and extending in a first direction; and
   a gate insulating layer and a gate electrode structure on the second active region of the peripheral circuit region,
   a dummy conductive layer in the peripheral circuit region, the dummy conductive layer including substantially a same material as the direct contact.

2. The semiconductor device of claim 1, wherein the dummy conductive layer is around the gate electrode structure or forms a portion of the gate electrode structure.

3. The semiconductor device of claim 1, wherein
   the gate electrode structure includes a first gate conductive pattern on the gate insulating layer, and
   the first gate conductive pattern includes a different material than the direct contact.

4. The semiconductor device of claim 3, wherein the dummy conductive layer is around the gate electrode structure.

5. The semiconductor device of claim 3, wherein a first conductive pattern of the bit line connected to the direct contact includes a different material than the direct contact, and the first conductive pattern of the bit line includes substantially a same material as the first gate conductive pattern.

6. The semiconductor device of claim 1, wherein a first conductive pattern of the bit line that contacts the direct contact comprises substantially a same material as the direct contact.

7. The semiconductor device of claim 6, wherein
   the gate electrode structure includes a first gate conductive pattern on the gate insulating layer, and
   the first gate conductive pattern includes a different material than the direct contact, and the dummy conductive layer is around the gate electrode structure.

8. The semiconductor device of claim 6, wherein
   the gate electrode structure includes a first gate conductive pattern on the gate insulating layer, and
   the first gate conductive pattern includes the dummy conductive layer.

9. The semiconductor device of claim 1, wherein the dummy conductive layer is configured as an etch stopping layer when an upper material layer on the dummy conductive layer is planarized.

10. The semiconductor device of claim 9, further comprising:
    a plurality of dummy conductive layers in the peripheral circuit region,
    wherein the upper material layer and a lower conductive layer remain between the plurality of dummy conductive layers after planarization of the upper material layer, and the lower conductive layer or one of the dummy conductive layers form a first gate conductive pattern of the gate electrode structure.

11. The semiconductor device of claim 1, wherein the cell array region comprises:
    a word line on the substrate, the word line having a buried structure and extending in a direction different from the first direction;

a buried insulating layer on the word line;
a buried contact between bit lines and connected to the first active region;
an insulating space structure at both sidewalls of at least one of the bit lines; and
a landing pad connected to the buried contact.

* * * * *